(12) United States Patent
Kang et al.

(10) Patent No.: US 12,261,105 B2
(45) Date of Patent: *Mar. 25, 2025

(54) SEMICONDUCTOR PACKAGE

(71) Applicant: SAMSUNG ELECTRONICS CO., LTD., Suwon-si (KR)

(72) Inventors: Myungsam Kang, Hwaseong-si (KR); Youngchan Ko, Seoul (KR); Jeongseok Kim, Cheonan-si (KR); Kyung Don Mun, Hwaseong-si (KR); Bongju Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/098,158

(22) Filed: Jan. 18, 2023

(65) Prior Publication Data

US 2023/0154836 A1 May 18, 2023

Related U.S. Application Data

(63) Continuation of application No. 17/228,784, filed on Apr. 13, 2021, now Pat. No. 11,569,158.

(30) Foreign Application Priority Data

Aug. 19, 2020 (KR) .......................... 10-2020-0104111

(51) Int. Cl.
*H01L 23/48* (2006.01)
*H01L 23/00* (2006.01)
(Continued)

(52) U.S. Cl.
CPC .... *H01L 23/49816* (2013.01); *H01L 23/3171* (2013.01); *H01L 23/49822* (2013.01);
(Continued)

(58) Field of Classification Search
CPC ........... H01L 23/49816; H01L 23/3171; H01L 23/49822; H01L 23/49833;
(Continued)

(56) References Cited

U.S. PATENT DOCUMENTS 8,176,628 B1   5/2012   Rusli et al.
9,449,953 B1 * 9/2016   Shih .................. H01L 23/5389
(Continued)

FOREIGN PATENT DOCUMENTS

CN       106170857 A       11/2016
CN       110858571 A        3/2020
(Continued)

*Primary Examiner* — Nicholas J Tobergte
(74) *Attorney, Agent, or Firm* — Muir Patent Law, PLLC

(57) ABSTRACT

A semiconductor package includes a redistribution substrate having a dielectric layer and a wiring pattern in the dielectric layer, the wiring pattern including a line part that extends horizontally, and a via part connected to the line part, the via part having a width less than a width of the line part, a passivation layer on a top surface of the redistribution substrate, the passivation layer including a material different from a material of the dielectric layer, a conductive pillar that penetrates the passivation layer, the conductive pillar being connected to the via part, and a connection terminal on a top surface of the conductive pillar, a distance between the top surface of the conductive pillar and a top surface of the passivation layer being greater than a thickness of the passivation layer.

20 Claims, 23 Drawing Sheets

(51) Int. Cl.
*H01L 23/31* (2006.01)
*H01L 23/498* (2006.01)
*H01L 23/538* (2006.01)

(52) U.S. Cl.
CPC .. *H01L 23/49833* (2013.01); *H01L 23/49838* (2013.01); *H01L 23/5385* (2013.01); *H01L 23/5386* (2013.01); *H01L 24/16* (2013.01); *H01L 2224/16235* (2013.01)

(58) Field of Classification Search
CPC ........... H01L 23/49838; H01L 23/5385; H01L 23/5386; H01L 24/16; H01L 2224/16235
See application file for complete search history.

(56) References Cited

U.S. PATENT DOCUMENTS

| | | | |
|---|---|---|---|
| 9,490,192 B1 | 11/2016 | Chen et al. | |
| 9,543,224 B1* | 1/2017 | Meyer | H01L 21/568 |
| 9,674,952 B1 | 6/2017 | Liu et al. | |
| 9,922,845 B1* | 3/2018 | Shih | H01L 21/6835 |
| 10,049,894 B2 | 8/2018 | Meng et al. | |
| 10,170,382 B2 | 1/2019 | Kim et al. | |
| 10,446,478 B2 | 10/2019 | Jeong et al. | |
| 10,475,759 B2 | 11/2019 | Jeng et al. | |
| 10,510,704 B2 | 12/2019 | Chen et al. | |
| 10,510,710 B2 | 12/2019 | Yu et al. | |
| 10,515,917 B2 | 12/2019 | Chuang et al. | |
| 10,522,438 B2 | 12/2019 | Cheng et al. | |
| 10,522,488 B1 | 12/2019 | Chen et al. | |
| 10,535,609 B2 | 1/2020 | Tsai et al. | |
| 10,602,621 B1 | 3/2020 | Hu | |
| 10,622,336 B2 | 4/2020 | Hsu et al. | |
| 10,685,916 B2 | 6/2020 | Shin et al. | |
| 10,796,997 B2 | 10/2020 | Lee et al. | |
| 11,145,611 B2 | 10/2021 | Kim et al. | |
| 2006/0291029 A1* | 12/2006 | Lin | H01L 24/12 257/E21.589 |
| 2011/0193220 A1* | 8/2011 | Kuo | H01L 24/11 257/737 |
| 2013/0285252 A1* | 10/2013 | Sun | H01L 21/6835 257/774 |
| 2014/0264828 A1 | 9/2014 | Chang et al. | |
| 2015/0243531 A1 | 8/2015 | Ho et al. | |
| 2016/0133601 A1* | 5/2016 | Ko | H01L 23/49833 257/738 |
| 2016/0190078 A1 | 6/2016 | Love et al. | |
| 2016/0276174 A1* | 9/2016 | Kim | H01L 23/5389 |
| 2017/0084558 A1 | 3/2017 | Seo et al. | |
| 2017/0125369 A1 | 5/2017 | Jeong et al. | |
| 2017/0365581 A1 | 12/2017 | Yu et al. | |
| 2018/0138137 A1 | 5/2018 | Jin et al. | |
| 2019/0214359 A1 | 7/2019 | Yeon et al. | |
| 2020/0066545 A1 | 2/2020 | Kim et al. | |
| 2021/0125960 A1 | 4/2021 | Huang et al. | |
| 2021/0135333 A1 | 5/2021 | Ho et al. | |
| 2021/0407944 A1 | 12/2021 | Wang | |
| 2022/0238441 A1 | 7/2022 | Kim et al. | |

FOREIGN PATENT DOCUMENTS

| | | |
|---|---|---|
| JP | 4835629 B2 | 12/2011 |
| KR | 10-0925669 B1 | 11/2009 |
| KR | 10-2014-0048692 A | 4/2014 |
| KR | 1020190011124 A | 2/2019 |
| KR | 10-2020-0058129 A | 5/2020 |
| TW | 201824471 A | 7/2018 |
| TW | 202010025 A | 3/2020 |
| TW | 202010061 A | 3/2020 |

\* cited by examiner

SEMICONDUCTOR PACKAGE

CROSS-REFERENCE TO RELATED APPLICATION

This is a continuation of U.S. patent application Ser. No. 17/228,784 filed Apr. 13, 2021, the contents of which are incorporated by reference.

Korean Patent Application No. 10-2020-0104111, filed on Aug. 19, 2020, in the Korean Intellectual Property Office, and entitled: "Semiconductor Package," is incorporated by reference herein in its entirety.

BACKGROUND

1. Field

Embodiments relate to a semiconductor package, and more particularly, to a semiconductor package including a redistribution substrate.

2. Description of the Related Art

The rapid development of electronic industry and user's requirements cause electronic products to get smaller and smaller. To fabricate electronic products with compactness, high performance, and large capacity, research and development are continuously conducted on semiconductor chip including through-silicon-via (TSV) structures and semiconductor packages including the same. For example, for high integration of semiconductor devices, a plurality of semiconductor chips may be stacked to form a multi-chip package, in which the plurality of semiconductor chips are mounted in a single semiconductor package, or a system-in package, in which stacked different chips are operated as one system.

SUMMARY

According to some example embodiments, a semiconductor package may include a redistribution substrate that includes a dielectric layer and a wiring pattern in the dielectric layer, the wiring pattern including a line part that horizontally extends and a via part connected to the line part, the via part having a width less than a width of the line part, a passivation layer on a top surface of the redistribution substrate, the passivation layer including a material different from a material of the dielectric layer, a conductive pillar that penetrates the passivation layer and is connected to the via part, and a connection terminal on a top surface of the conductive pillar. A distance between the top surface of the conductive pillar and a top surface of the passivation layer may be greater than a thickness of the passivation layer.

According to some example embodiments, a semiconductor package may include a redistribution substrate that includes a dielectric layer and a wiring pattern in the dielectric layer, a passivation layer on a top surface of the dielectric layer, a conductive pillar that penetrates the passivation layer and is electrically connected to the wiring pattern, and a connection terminal on a top surface of the conductive pillar, the connection terminal having a bottom surface at a vertical level higher than a vertical level of a top surface of the passivation layer. The wiring pattern may include a line part that horizontally extends and a via part between the line part and a bottom surface of the conductive pillar. The bottom surface of the conductive pillar may have a width greater than a width at a top surface of the via part.

According to some example embodiments, a semiconductor package may include a redistribution substrate that includes a dielectric layer and a plurality of wiring patterns in the dielectric layer, each of the wiring patterns including a line part that horizontally extends and a via part on the line part, the via part having a width less than a width of the line part, a first passivation layer on a top surface of the dielectric layer, a conductive pillar that penetrates the first passivation layer and is connected to the via part, a first connection terminal on a top surface of the conductive pillar, a second passivation layer on a bottom surface of the dielectric layer, the second passivation layer covering a bottom surface and a lateral surface of the line part, a conductive support pattern that penetrates the second passivation layer and is connected to the line part, and a second connection terminal on a bottom surface of the conductive support pattern. The conductive pillar may have a thickness greater than a thickness of the conductive support pattern.

BRIEF DESCRIPTION OF THE DRAWINGS

Features will become apparent to those of skill in the art by describing in detail exemplary embodiments with reference to the attached drawings, in which.

DETAILED DESCRIPTION

In this description, the terms "top surface" and "bottom surface" are used to briefly explain components. However, the terms "top surface" and "bottom surface" are merely adopted to distinguish one surface of the component from another surface of the component. According to some example embodiments, the languages "top surface" and "bottom surface" of any component included in a semiconductor package are interchangeably used based on a direction in which the semiconductor package is disposed. Therefore, any surface called "top surface" in one embodiment may be referred to as "bottom surface" in another embodiment, and any surface called "bottom surface" in one embodiment may be referred to as "top surface" in another embodiment.

Figure 1:
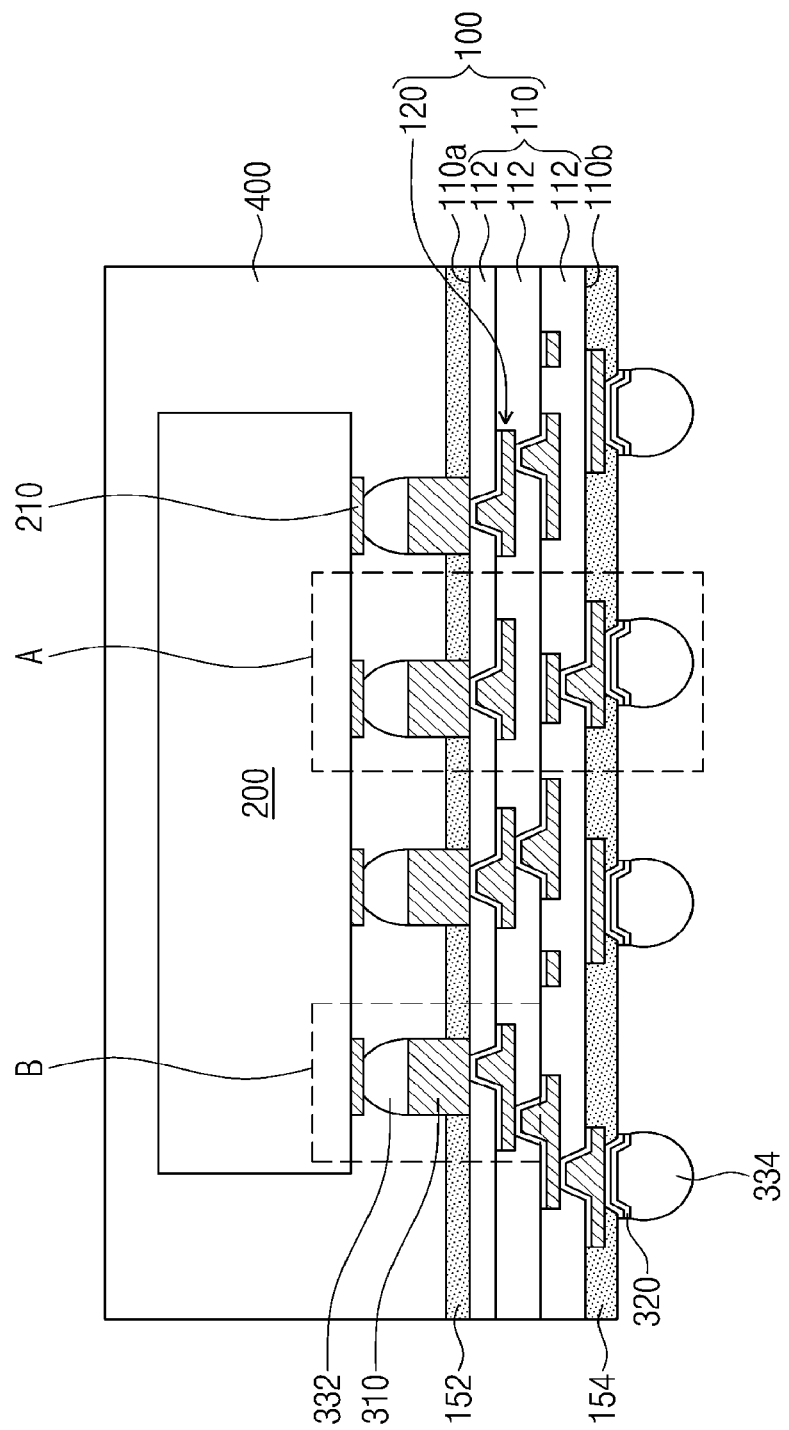
FIG. 1 illustrates a cross-sectional view of a semiconductor package according to some example embodiments.

FIG. 1 illustrates a cross-sectional view of a semiconductor package according to some example embodiments. FIG.

2A illustrates an enlarged cross-sectional view of section A of FIG. 1. FIG. 2B illustrates an enlarged cross-sectional view of section B of FIG. 1.

Figure 2A:
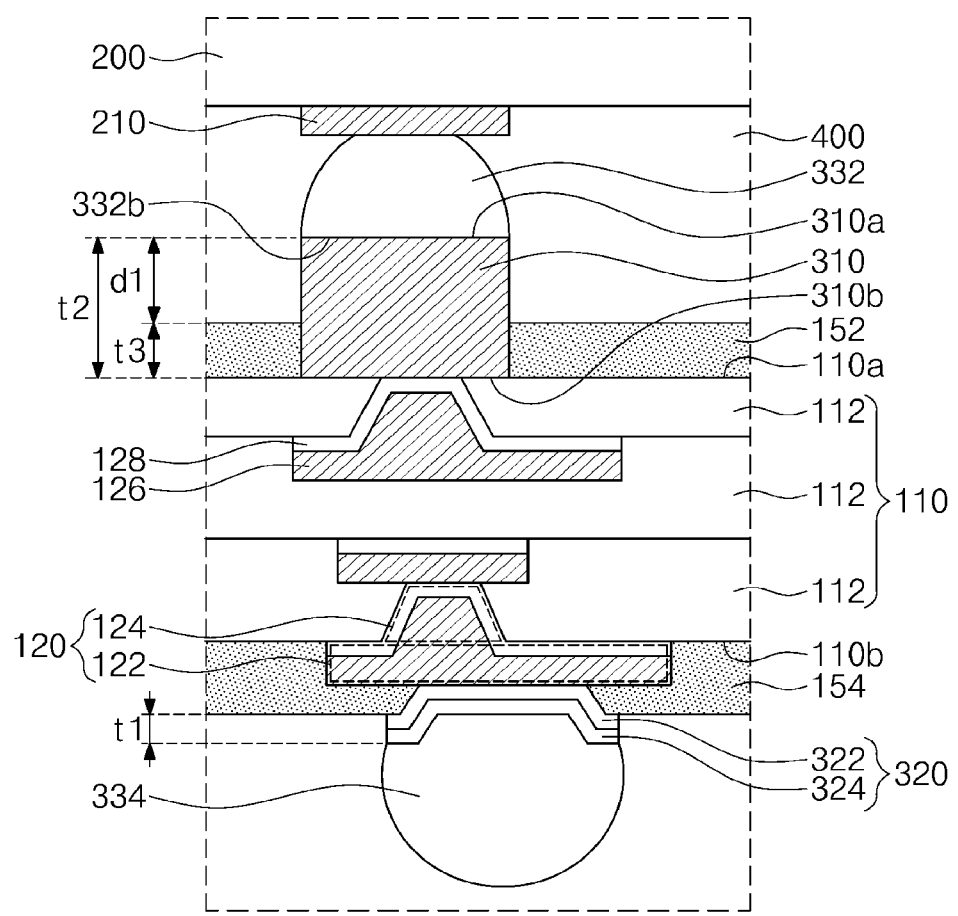
FIG. 2A illustrates an enlarged cross-sectional view of section A of FIG. 1.
Figure 2B:
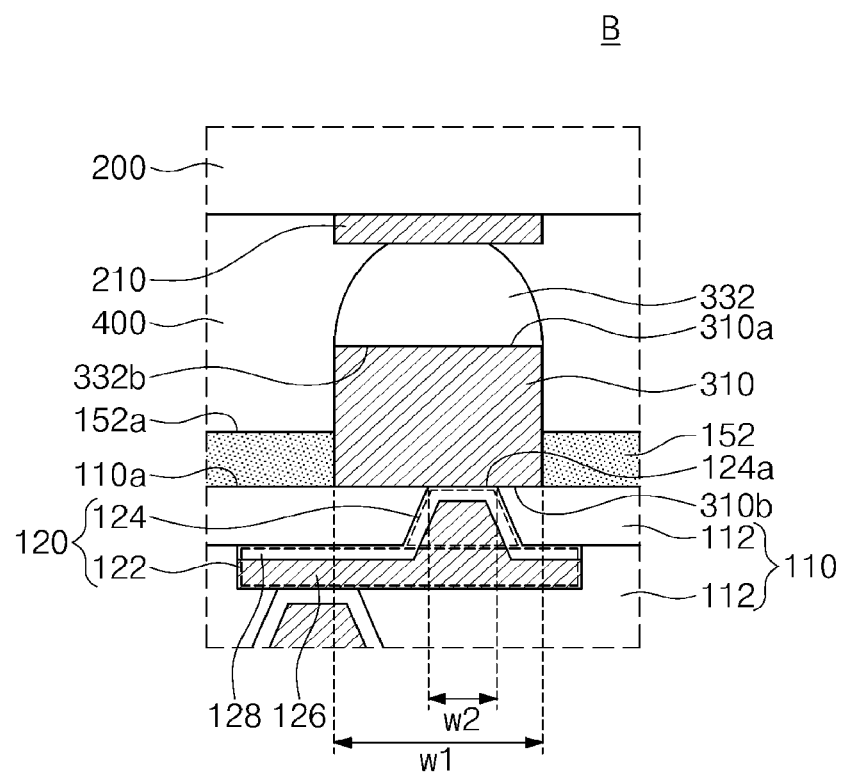
FIG. 2B illustrates an enlarged cross-sectional view of section B of FIG. 1.

Referring to FIGS. 1, 2A, and 2B, a semiconductor package may include a redistribution substrate 100, a semiconductor chip 200 on the redistribution substrate 100, a molding layer 400 that covers the semiconductor chip 200, and connection members that connect the semiconductor chip 200 to an external device. The connection members may include first connection terminals 332, conductive pillars 310, second connection terminals 334, and conductive support patterns 320. The semiconductor package may be a fan-out semiconductor package.

The redistribution substrate 100 may include a dielectric layer 110 and wiring patterns 120 in the dielectric layer 110. The dielectric layer 110 may include dielectric patterns 112 that are stacked between a bottom surface of a first passivation layer 152 and a top surface of a second passivation layer 154. For example, the dielectric patterns 112 may include an inorganic material, e.g., one or more of silicon oxide ($SiO_x$), silicon nitride ($SiN_x$), and silicon oxynitride (SiON). In another example, the dielectric patterns 112 may include a photosensitive polymer, e.g., one or more of photosensitive polyimide, polybenzoxazole, phenolic polymers, and benzocyclobutene polymers. The dielectric layer 110 may include three dielectric patterns 112 that are vertically stacked, but example embodiments are not limited thereto, e.g., the dielectric layer 110 may include four or more dielectric patterns 112 that are vertically stacked.

The wiring patterns 120 may be disposed in the dielectric layer 110. As shown in FIGS. 2A and 2B, the wiring patterns 120 may each include a line part 122 and a via part 124.

The line parts 122 of the wiring patterns 120 may extend horizontally. For example, the line parts 122 may extend in a direction parallel to one surface of the dielectric pattern 112 to thereby constitute an electrical circuit. The line part 122 may have a top surface coplanar with a bottom surface of the dielectric pattern 112, and may also have lateral and bottom surfaces surrounded by the dielectric pattern 112 or the second passivation layer 154. The bottom surface of the line part 122 may be parallel to a top surface 110a and a bottom surface 110b of the dielectric layer 110. The line part 122 may have a thickness ranging from about 3 μm to about 5 μm.

Referring to FIG. 2B, the via part 124 of the wiring pattern 120 may be provided on and connected to the line part 122 of the wiring pattern 120. The via part 124 may be positioned closer than the line part 122 to the top surface 110a of the dielectric layer 110. The via part 124 may have a width less than that of the line part 122. The width of the via part 124 may decrease with decreasing distance from the top surface 110a of the dielectric layer 110. The via part 124 may penetrate at least a portion of the dielectric pattern 112 to thereby electrically connect the line parts 122 located at different levels. In addition, the via part 124 of an uppermost wiring pattern 120 may completely penetrate an uppermost dielectric pattern 112 to thereby electrically connect the conductive pillar 310 to the line part 122 of the uppermost wiring pattern 120.

Each of the wiring patterns 120 may include a conductive layer 126 and a seed layer 128. The conductive layer 126 may include a conductive material, e.g., metal. The metal included in the conductive layer 126 may be, e.g., copper (Cu). The seed layer 128 may include a conductive material, e.g., titanium (Ti) and/or tantalum (Ta). The seed layer 128 may have a thickness less than that of the conductive layer 126. The seed layer 128 may have a thickness of, e.g., about 5 angstroms to about 50 angstroms. According to some example embodiments, the seed layers 128 may be formed for performing a plating process before forming the conductive layers 126. The seed layer 128 may directly contact the conductive layer 126.

For example, each of the via and line parts 124 and 122 of the wiring pattern 120 may include the conductive layer 126 and the seed layer 128 on the conductive layer 126. The conductive layer 126 of the line part 122 may have a top surface that is partially covered with the seed layer 128. The second passivation layer 154 may surround lateral and bottom surfaces of the line part 122 of a lowermost wiring pattern 120. The dielectric pattern 112 may surround lateral and bottom surfaces of the conductive layer 126 of the line part 122 included in each of the wiring patterns 120 other than the lowermost wiring pattern 120.

The conductive layer 126 of the via part 124 may have a width that decreases with decreasing distance from the top surface 110a of the dielectric layer 110. The conductive layers 126 of the via and line parts 124 and 122 may be connected to each other without a boundary therebetween, e.g., as a single and seamless unit. The seed layer 128 of the via part 124 may conformally cover top and lateral surfaces of the conductive layer 126 of the via part 124.

As shown in FIG. 2B, the conductive pillar 310 may be directly connected to the uppermost wiring pattern 120 disposed most adjacent to the top surface 110a of the dielectric layer 110. The line part 122 of the uppermost wiring pattern 120 may be positioned on a bottom surface of the uppermost dielectric pattern 112. The via part 124 of the uppermost wiring pattern 120 may be positioned between the line part 122 of the uppermost wiring pattern 120 and a bottom surface 310b of the conductive pillar 310. The via part 124 of the uppermost wiring pattern 120 may penetrate at least a portion of the uppermost dielectric pattern 112 to thereby electrically connect the conductive pillar 310 to the line part 122 of the uppermost wiring pattern 120. The via part 124 of the uppermost wiring pattern 120 may have a top surface 124a (or a top surface of the seed layer 128) that has a width w2 smaller than a width w1 of the bottom surface 310b of the conductive pillar 310, e.g., the bottom surface 310b of the conductive pillar 310 may cover and overlap the entire top surface 124a of the via part 124 (or the top surface of the seed layer 128).

The first passivation layer 152 may be disposed on the top surface 110a of the dielectric layer 110. The first passivation layer 152 may cover a top surface of the uppermost dielectric pattern 112 of the dielectric layer 110. According to some example embodiments, the first passivation layer 152 may include a dielectric polymer, e.g., an epoxy-based polymer. The first passivation layer 152 may include, e.g., an Ajinomoto build-up film (ABF). The first passivation layer 152 may include a photosensitive material, e.g., a photo-imageable dielectric (PID). The first passivation layer 152 may partially cover a lateral surface of the conductive pillar 310. As illustrated in FIG. 2A, the first passivation layer 152 may have a thickness t3 equal to or less than half a thickness t2 of the conductive pillar 310. For example, a distance d1 between a top surface 310a of the conductive pillar 310 and a top surface of the first passivation layer 152 may be greater than the thickness t3 of the first passivation layer 152. The distance d1 between the top surface 310a of the conductive pillar 310 and the top surface of the first passivation layer 152 may have a value ranging from about 2 times to about 5 times the thickness t3 of the first passivation layer 152.

The conductive pillar 310 may penetrate the first passivation layer 152 and may be connected to the wiring pattern 120 in the redistribution substrate 100. The conductive pillar 310 may be flat at the top and bottom surfaces 310a and 310b thereof. The bottom surface 310b of the conductive pillar 310 may cover the top surface of the uppermost dielectric pattern 112 and an upmost surface of the seed layer 128. The bottom surface 310b of the conductive pillar 310 may be coplanar with the bottom surface of the first passivation layer 152. The top surface 310a of the conductive pillar 310 may be parallel to the bottom surface 310b of the conductive pillar 310. According to some example embodiments, the conductive pillar 310 may have a cylindrical shape or a tetragonal pillar shape. Therefore, the conductive pillar 310 may have a tetragonal or trapezoidal shape at its cross-section taken along a vertical direction. The conductive pillar 310 may include metal, e.g., copper.

The width w1 of the bottom surface 310b of the conductive pillar 310 may be greater than the width w2 of the top surface 124a of the via part 124 included in each of the wiring patterns 120, as illustrated in FIG. 2B. The width w1 at the bottom surface 310b of the conductive pillar 310 may have a value ranging from about 2 times to about 5 times the width w2 at the top surface 124a of the via part 124 included in the uppermost wiring pattern 120. Therefore, the top surface 124a of the via part 124 included in the uppermost wiring pattern 120 may cover a portion of the bottom surface 310b of the conductive pillar 310, but may not cover other portion of the bottom surface 310b of the conductive pillar 310, e.g., the top surface 124a of the via part 124 may cover only a portion of the bottom surface 310b of the conductive pillar 310. The top surface 124a of the seed layer 128 included in the uppermost wiring pattern 120 may directly contact the bottom surface 310b of the conductive pillar 310.

The semiconductor chip 200 may be provided on the redistribution substrate 100. The semiconductor chip 200 may include a semiconductor substrate, integrated circuits on the semiconductor substrate, wiring lines connected to the integrated circuits, and chip pads 210 connected to the wiring lines. The chip pads 210 may be electrically connected through the wiring lines to the integrated circuits of the semiconductor chip 200. The chip pads 210 of the semiconductor chip 200 may be disposed between a bottom surface of the semiconductor chip 200 and the top surface 110a of the dielectric layer 110, e.g., the chip pads 210 may be directly on a bottom surface of the semiconductor chip 200. The chip pads 210 may include metal, e.g., aluminum. The chip pads 210 of the semiconductor chip 200 may be formed to vertically overlap the conductive pillars 310. According to some example embodiments, the chip pads 210 may have the same width as that of the conductive pillars 310 and may be arranged at the same pitch as that of the conductive pillars 310, e.g., the chip pads 210 may be aligned with and completely overlap tops of respective conductive pillars 310.

The first connection terminals 332 may be disposed between the semiconductor chip 200 and the conductive pillars 310. The first connection terminals 332 may electrically connect the conductive pillars 310 to the chip pads 210 of the semiconductor chip 200. The first connection terminals 332 may include, e.g., a solder ball or a solder bump. The first connection terminal 332 may directly contact the top surface 310a of the conductive pillar 310 and a bottom surface of the chip pad 210. The first connection terminal 332 may have a width that decreases with increasing distance from the top surface 310a of the conductive pillar 310. The first connection terminal 332 may completely cover the top surface 310a of the conductive pillar 310. The first connection terminal 332 may partially cover the bottom surface of the chip pad 210. For example, the first connection terminal 332 may include, e.g., tin (Sn), indium (In), bismuth (Bi), antimony (Sb), copper (Cu), silver (Ag), zinc (Zn), lead (Pb), or any alloy thereof, e.g., Sn, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

The conductive support pattern 320 may be disposed on a bottom surface of the second passivation layer 154. The conductive support pattern 320 may, e.g., partially, penetrate the second passivation layer 154 and may be connected to the wiring pattern 120 in the redistribution substrate 100. The conductive support pattern 320 may be connected to the bottom surface of the line part 122. As illustrated in FIG. 2A, the conductive support pattern 320 may have a thickness t1 and may have an uneven, e.g., non-flat, shape. The conductive support pattern 320 may have top and bottom surfaces that are more uneven than the top and bottom surfaces 310a and 310b of the conductive pillar 310. A central portion of the top surface of the conductive support pattern 320 may protrude toward the top surface 110a of the dielectric layer 110. A central portion of the bottom surface of the conductive support pattern 320 may be recessed toward the top surface 110a of the dielectric layer 110.

The conductive support pattern 320 may include a first conductive pattern 322 and a second conductive pattern 324 between the first conductive pattern 322 and the second connection terminal 334. The first and second conductive patterns 322 and 324 may include a conductive material, e.g., metal. The first and second conductive patterns 322 and 324 may include different materials from each other. For example, the first conductive pattern 322 may include titanium (Ti) and/or tungsten (W), and the second conductive pattern 324 may include copper (Cu).

The second connection terminals 334 may be disposed on the bottom surfaces of the conductive support patterns 320, respectively. The second connection terminals 334 may be electrically connected to the semiconductor chip 200 through the redistribution substrate 100, the conductive pillars 310, and the first connection terminals 332. The second connection terminal 334 may fill the recessed central portion of the bottom surface of the conductive support pattern 320. The second connection terminal 334 may directly contact the second conductive pattern 324 of the conductive support pattern 320. The second connection terminals 334 may have therebetween a pitch greater than that of the first connection terminals 332. In addition, the second connection terminal 334 may have a width greater than that of the first connection terminal 332. The second connection terminals 334 may include, e.g., a solder ball or a solder bump. For example, the second connection terminal 334 may include tin (Sn), indium (In), bismuth (Bi), antimony (Sb), copper (Cu), silver (Ag), zinc (Zn), lead (Pb), or any alloy thereof, e.g., Sn, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

The first passivation layer 152 may be provided thereon with the molding layer 400 that covers top, bottom, and lateral surfaces of the semiconductor chip 200. The molding layer 400 may fill a space between the semiconductor chip 200 and the first passivation layer 152. The molding layer 400 may cover the top surface of the first passivation layer 152 and a portion of the lateral surface of the conductive pillar 310. In addition, the molding layer 400 may cover lateral surfaces of the first connection terminals 332. The molding layer 400 may have a bottom surface in direct contact with the top surface of the first passivation layer 152.

The bottom surface of the molding layer 400 may be located at a level that is closer to the bottom surface 310b of the conductive pillar 310 than to the top surface 310a of the conductive pillar 310. For example, a contact area between the molding layer 400 and the conductive pillar 310 may be greater than a contact area between the first passivation layer 152 and the conductive pillar 310. The molding layer 400 may include a different material from those of the first passivation layer 152 and the dielectric pattern 112. The molding layer 400 may include a dielectric polymer, e.g., an epoxy molding compound (EMC).

FIGS. 3 to 9 illustrate enlarged cross-sectional views of section B of FIG. 1, according to some example embodiments. A duplicate description will be omitted below.

Figure 3:
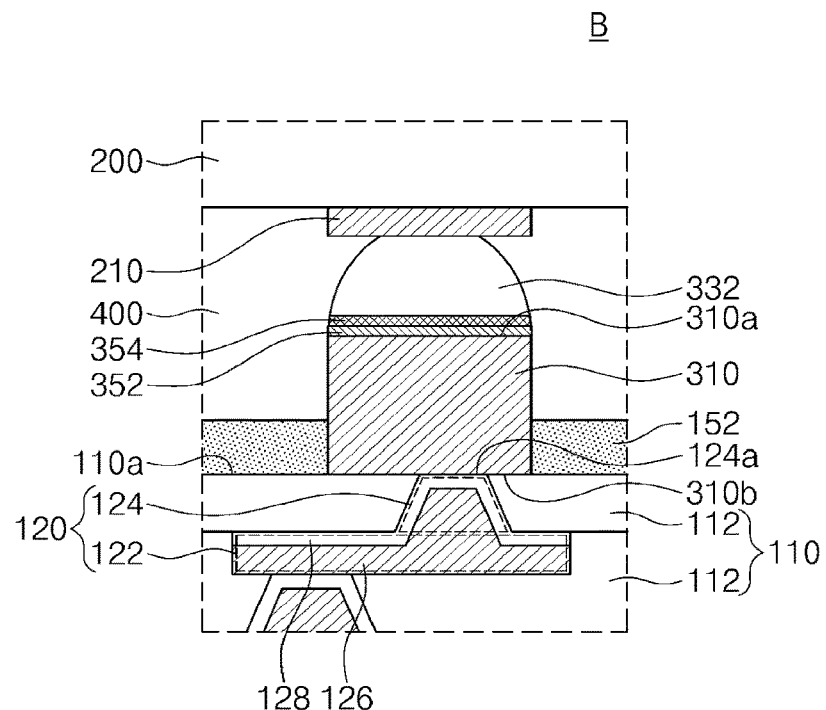
FIGS. 3 to 9 illustrate enlarged cross-sectional views of section B of FIG. 1, showing a semiconductor package according to some example embodiments.

Referring to FIG. 3, a semiconductor package according to some example embodiments may include a first metal layer 352 on the conductive pillar 310, and may also include a second metal layer 354 between the first metal layer 352 and the first connection terminal 332. For example, as illustrated in FIG. 3, the first and second metal layers 352 and 354 may be only on the top surface of the conductive pillar 310. The first and second metal layers 352 and 354 may include different metallic materials from each other. For example, the first metal layer 352 may include nickel (Ni), and the second metal layer 354 may include gold (Au). An electroplating process may be used to selectively form the first and second metal layers 352 and 354 on the top surface 310a of the conductive pillar 310.

Figure 4:
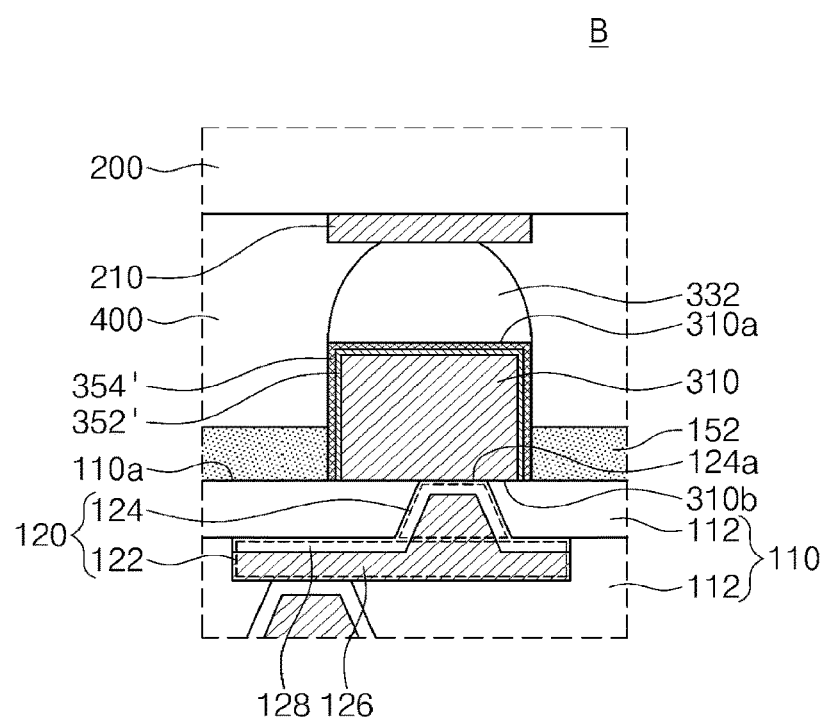

Referring to FIG. 4, a semiconductor package according to some example embodiments may include a first metal layer 352' that conformally covers the lateral surface and the top surface 310a of the conductive pillar 310, and a second metal layer 354' that conformally covers a surface of the first metal layer 352'. For example, the first metal layer 352' may be interposed between the conductive pillar 310 and the second metal layer 354'. The first passivation layer 152 may be spaced apart from the lateral surface of the conductive pillar 310 across the first and second metal layers 352' and 354'. The first and second metal layers 352' and 354' may extend to a level the same as that of a bottom surface of the conductive pillar 310, thereby contacting the top surface 110a of the dielectric layer 110.

Figure 5:
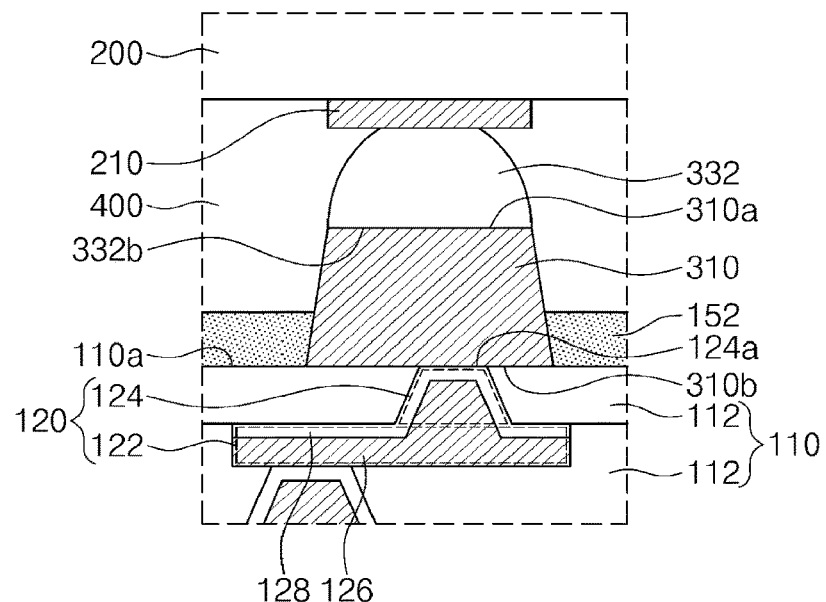

Referring to FIG. 5, the conductive pillar 310 may have a width that decreases with increasing distance from the top surface 110a of the dielectric layer 110. Therefore, the conductive pillar 310 may have a trapezoidal shape at its cross-section taken along a vertical direction. The conductive pillar 310 may have a tapered shape at its lateral surface. The conductive pillar 310 may have a maximum width at a same level as that of the bottom surface 310b thereof, and may have a minimum width at a same level as that of the top surface 310a thereof. Therefore, the first connection terminal 332 may have a bottom surface 332b with a width that is less than that of the bottom surface 310b of the conductive pillar 310.

Figure 6:
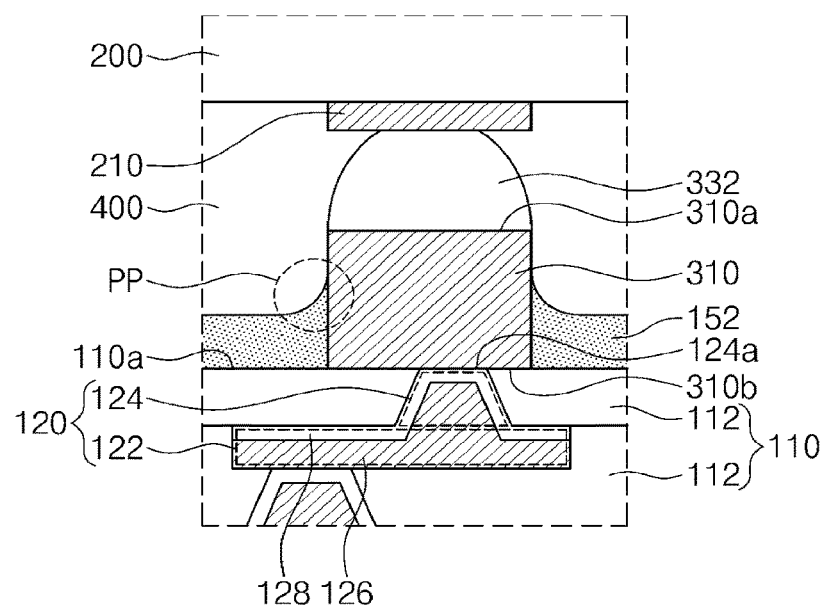

Referring to FIG. 6, the first passivation layer 152 may have a protrusion PP that protrudes in a direction away from the dielectric layer 110. The protrusion PP may be positioned on the lateral surface of the conductive pillar 310. The first passivation layer 152 may have a thickness that increases with decreasing distance from the lateral surface of the conductive pillar 310. For example, the top surface of the first passivation layer 152 may be located at a level that becomes higher with decreasing distance from the lateral surface of the conductive pillar 310. According to some example embodiments, the first passivation layer 152 may have an uppermost surface below a vertical center of the conductive pillar 310.

Figure 7:
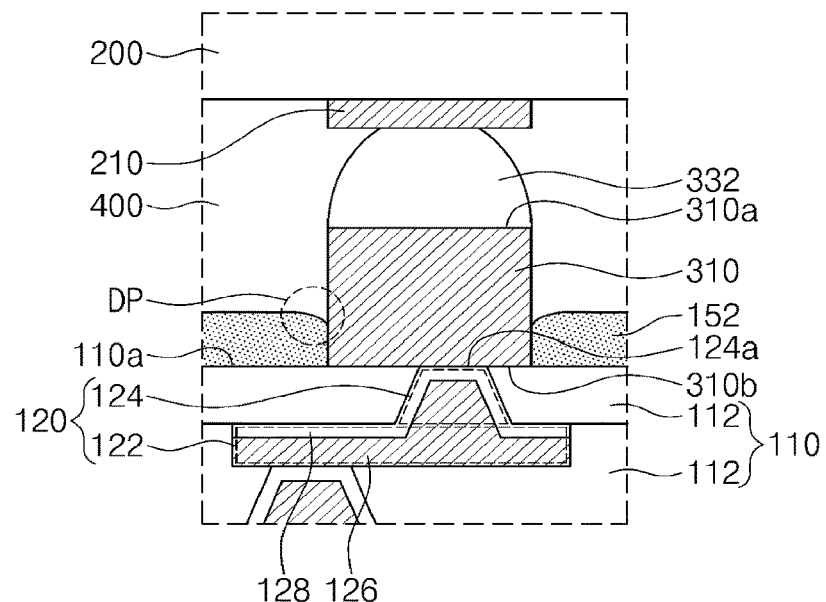

Referring to FIG. 7, the first passivation layer 152 may have a depression DP that is recessed toward the dielectric layer 110. The depression DP may be positioned on the lateral surface of the conductive pillar 310. The first passivation layer 152 may have a thickness that decreases with decreasing distance from the lateral surface of the conductive pillar 310. For example, the top surface of the first passivation layer 152 may be located at a level that becomes lower with decreasing distance from the lateral surface of the conductive pillar 310. The molding layer 400 may fill the depression DP.

Figure 8:
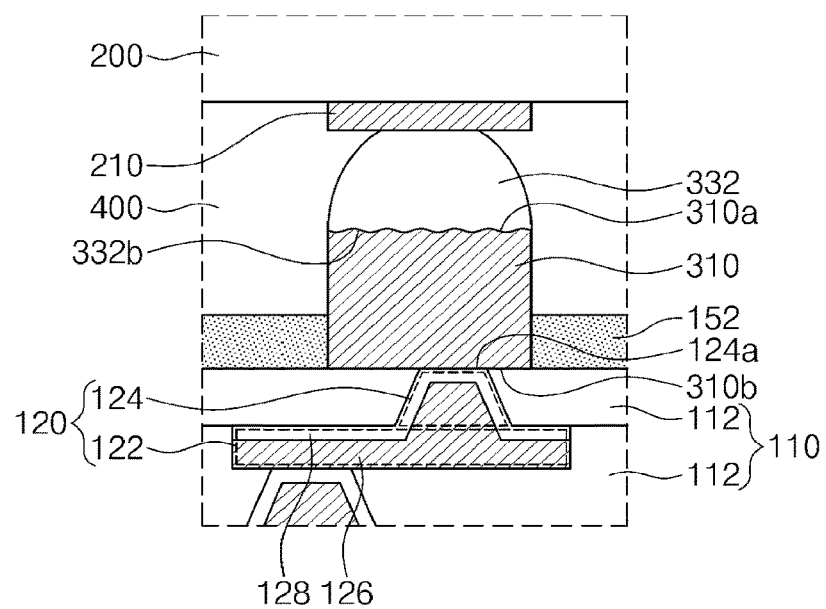

Referring to FIG. 8, the conductive pillar 310 may have a surface roughness that is greater at the top surface 310a than at the bottom surface 310b. The top surface 310a of the conductive pillar 310 may include a plurality of fine protrusions and a plurality of depressions. The first connection terminal 332 may fill the plurality of depressions and may completely cover the top surface 310a of the conductive pillar 310. Therefore, the bottom surface 332b of the first connection terminal 332 may have a surface roughness substantially the same as that of the top surface of the conductive pillar 310. Compared to a case where the conductive pillar 310 and the first connection terminal 332 have a flat interface between the top surface 310a and the bottom surface 332b, the conductive pillar 310 and the first connection terminal 332 may have a higher adhesive property and a greater contact area between the top surface 310a and the bottom surface 332b. Accordingly, a semiconductor package may increase in stability and may decrease in contact area.

Figure 9:
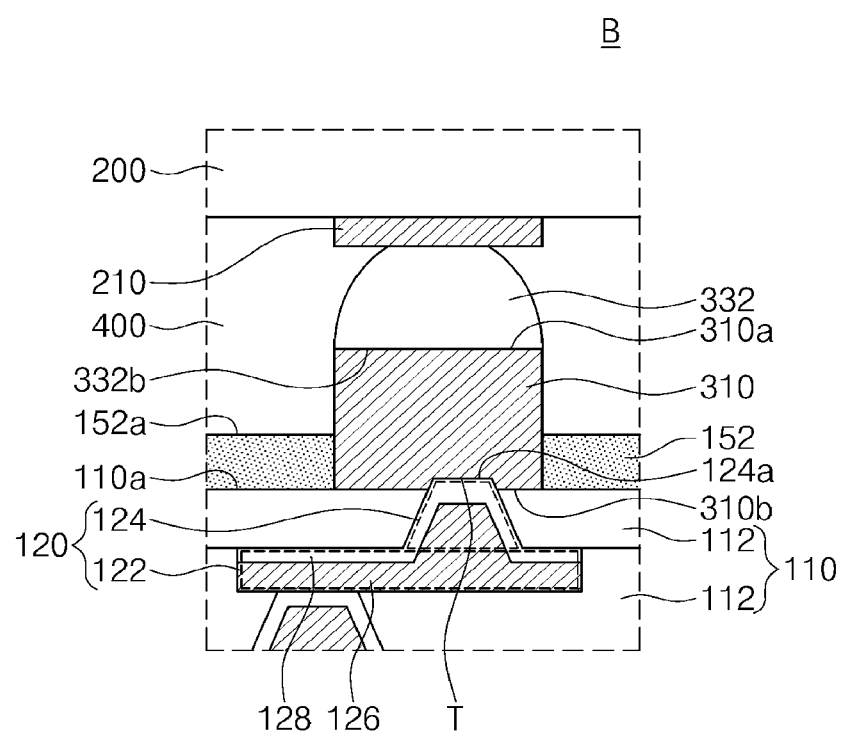

Referring to FIG. 9, the top surface 124a of the via part 124 included in the wiring pattern 120 may be located at a vertical level higher than that of the bottom surface 310b of the conductive pillar 310. The via part 124 of the wiring pattern 120 may be partially inserted into the bottom surface 310b of the conductive pillar 310. The via part 124 and the conductive pillar 310 may thus have therebetween an increased contact area and a decreased contact resistance. The top surface 124a of the via part 124 may be located at a vertical level higher than that of the top surface 110a of the dielectric layer 110 and lower than that of a top surface 152a of the first passivation layer 152. The top surface of the conductive layer 126 of the via part 124 included in the wiring pattern 120 may be located at a vertical level lower than that of the bottom surface 310b of the conductive pillar 310.

The conductive pillar 310 may have on its bottom surface 310b a trench T into which the via part 124 of the wiring pattern 120 is inserted. The trench T may be formed when the bottom surface 310b of the conductive pillar 310 is over-etched in forming a second hole H2 which will be discussed below with reference to FIG. 12.

FIGS. 10 to 16 illustrate cross-sectional views of stage in a method of fabricating a semiconductor package according to some example embodiments.

Figure 10:
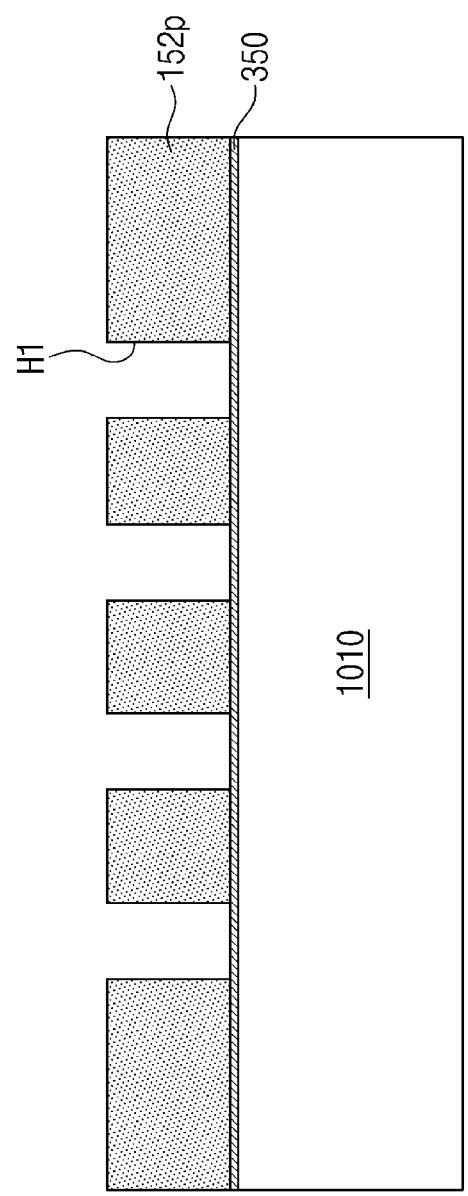
FIGS. 10 to 17 illustrate cross-sectional views of stages in a method of fabricating a semiconductor package according to some example embodiments.

Referring to FIG. 10, a lower seed layer 350 and a preliminary first passivation pattern 152p may be formed on a first carrier substrate 1010.

The lower seed layer 350 may be formed to conformally cover a top surface of the first carrier substrate 1010. A deposition process may be used to form the lower seed layer 350. The lower seed layer 350 may include a conductive material. For example, the lower seed layer 350 may include one or more of copper, titanium, and an alloy thereof.

According to some example embodiments, the lower seed layer 350 may include a plurality of metal layers, and the metal layers may include two or more of copper, titanium, and an alloy thereof.

The preliminary first passivation layer 152p may be formed on the lower seed layer 350. For example, the formation of the preliminary first passivation layer 152p may include coating on the lower seed layer 350 a photosensitive material to form a preliminary passivation dielectric layer, and patterning the preliminary passivation dielectric layer to form first holes H1 that expose a top surface of the lower seed layer 350. The photosensitive material may include a photosensitive polymer, e.g. one or more of photosensitive polyimide, polybenzoxazole, phenolic polymers, and benzocyclobutene polymers. Exposure and development processes may be performed to pattern the preliminary passivation dielectric layer. The exposure process may be a negative tone exposure process or a positive tone exposure process.

In another example, the formation of the preliminary first passivation layer 152p may include performing on the lower seed layer 350 a deposition process to form a preliminary passivation dielectric layer, and patterning the preliminary passivation dielectric layer to form the first holes H1 that expose the top surface of the lower seed layer 350. The deposition process may include, e.g., a chemical vapor deposition process. A dry etching process may be used to pattern the preliminary passivation dielectric layer.

Figure 11:
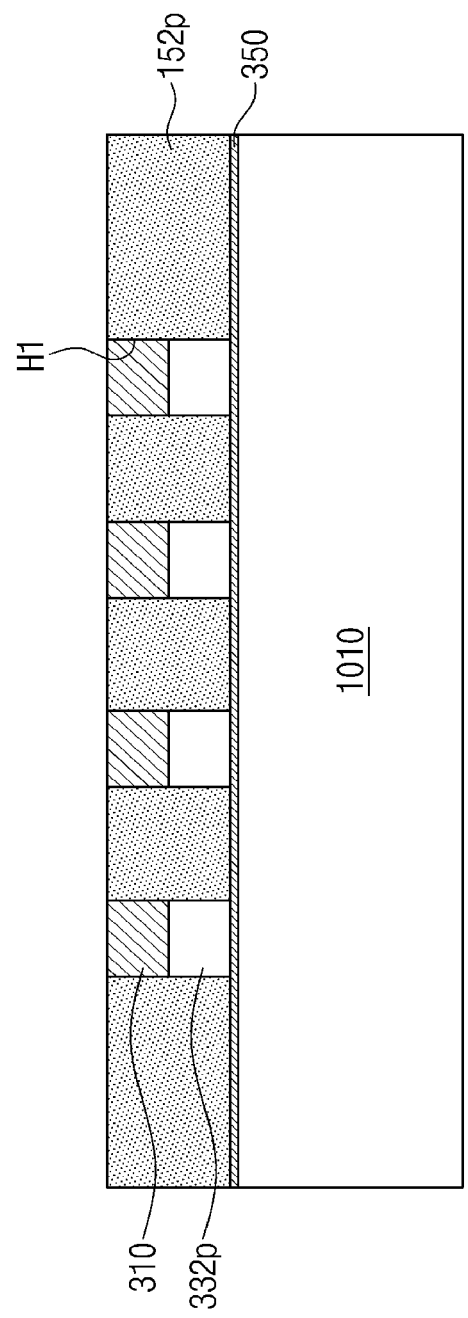

Referring to FIG. 11, preliminary first connection terminals 332p and conductive pillars 310 may be formed in the first holes H1. The preliminary first connection terminals 332p may be directly formed on the lower seed layer 350. The preliminary first connection terminals 332p may be formed by performing an electroplating process in which the lower seed layer 350 is used as an electrode. For example, the preliminary first connection terminal 332p may include tin (Sn), indium (In), bismuth (Bi), antimony (Sb), copper (Cu), silver (Ag), zinc (Zn), lead (Pb), or any alloy thereof, e.g., Sn, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

The conductive pillars 310 may be formed on the preliminary first connection terminals 332p. The conductive pillars 310 may be formed by performing an electroplating process in which the lower seed layer 350 and the preliminary first connection terminals 332p are used as an electrode. The conductive pillars 310 may include, e.g., copper (Cu).

Figure 12:
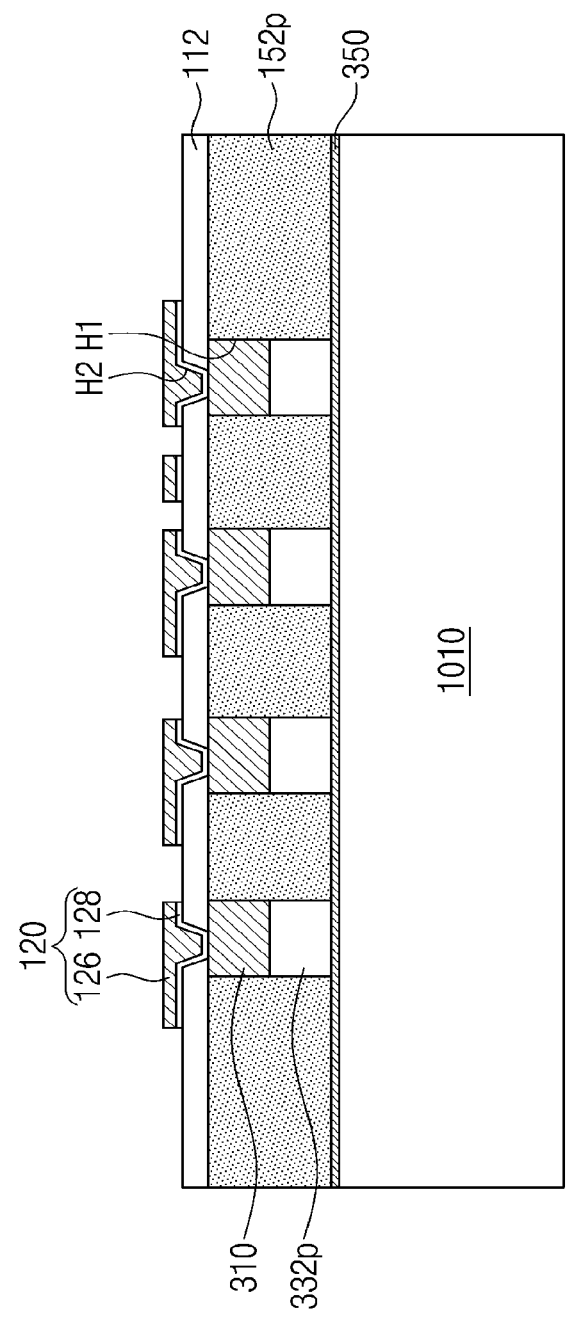

Referring to FIG. 12, the dielectric pattern 112 may be formed on a top surface of the preliminary passivation layer 152p and top surfaces of the conductive pillars 310. The dielectric pattern 112 may be formed by performing a coating process, e.g., spin or slit coating, and a curing process, e.g., a thermal curing. The dielectric pattern 112 may be patterned to form second holes H2, each of which exposes the top surface of the conductive pillar 310.

Thereafter, the wiring patterns 120 may be formed to fill the second holes H2. The formation of the wiring patterns 120 may include forming a preliminary seed layer that covers a top surface of the dielectric pattern 112 and inner walls of the second holes H2, forming a resist pattern that partially covers a top surface of the preliminary seed layer, and forming the conductive layer 126 between the resist patterns. The conductive layer 126 may be formed by performing an electroplating process in which the preliminary seed layer is used as an electrode. After the conductive layer 126 is formed, the resist pattern may be removed. The preliminary seed layer may undergo a wet etching process in which the conductive layer 126 is used as an etching mask to form the seed layer 128.

Figure 13:
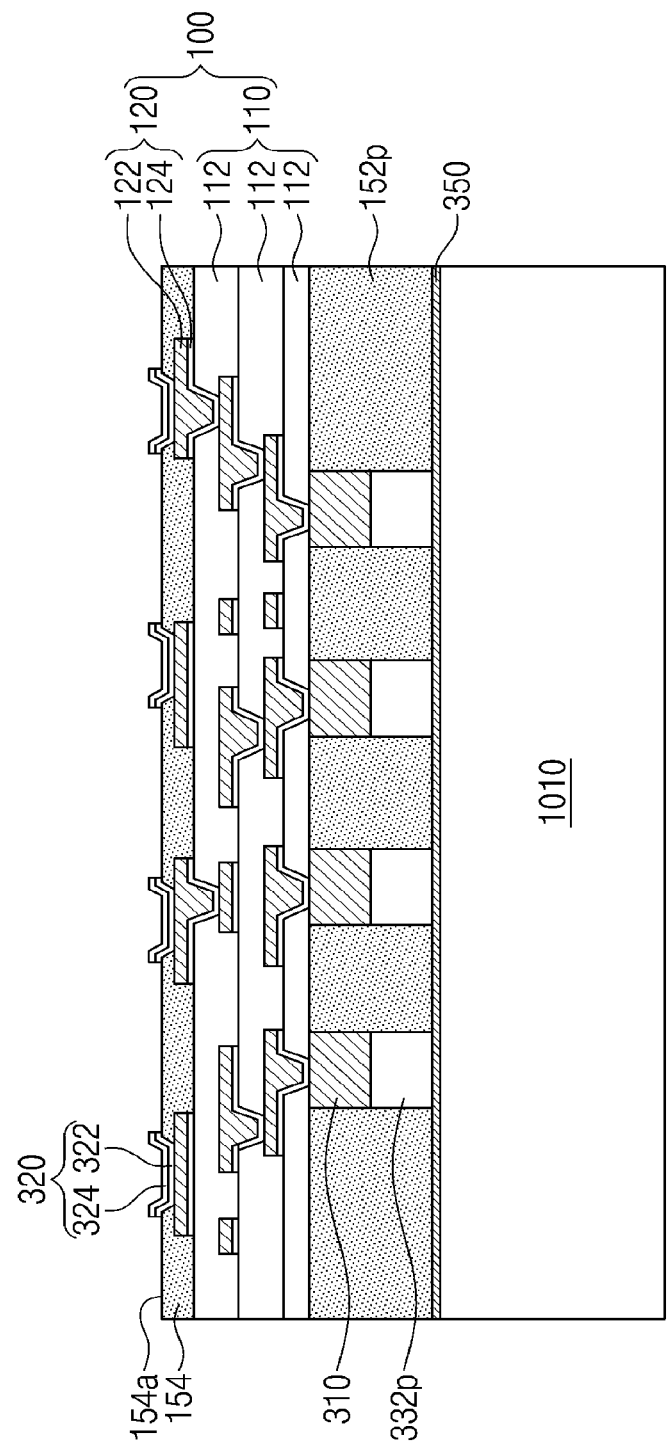

Referring to FIG. 13, the process to form the dielectric pattern 112 and the process to form the wiring patterns 120 may be repeatedly performed to form the redistribution substrate 100. According to some example embodiments, the dielectric patterns 112 may be vertically stacked to connect each other, thereby constituting a single dielectric layer 110.

On the dielectric layer 110, the second passivation layer 154 may be formed to cover the uppermost wiring patterns 120. The formation of the second passivation layer 154 may include coating on the dielectric layer 110 a photosensitive material to form a preliminary passivation dielectric layer, and patterning the preliminary passivation dielectric layer to expose top surfaces of the uppermost wiring patterns 120. The photosensitive material may include a photosensitive polymer, e.g., one or more of photosensitive polyimide, polybenzoxazole, phenolic polymers, and benzocyclobutene polymers. Exposure and development processes may be performed to pattern the preliminary passivation dielectric layer. The exposure process may be a negative tone exposure process or a positive tone exposure process.

In another example, the formation of the second passivation layer 154 may include performing on the dielectric layer 110 a deposition process to form a preliminary passivation dielectric layer, and patterning the preliminary passivation dielectric layer to expose top surfaces of the uppermost wiring patterns 120. The deposition process may include, e.g., a chemical vapor deposition process. A dry etching process may be used to pattern the preliminary passivation dielectric layer.

The conductive support patterns 320 may be formed on the top surfaces of the uppermost wiring patterns 120, which top surfaces are exposed by the second passivation layer 154. The formation of the conductive support pattern 320 may include sequentially performing depositing and patterning process to form the first conductive pattern 322 and the second conductive pattern 324. A chemical vapor deposition process may be adopted as the deposition process for forming the first conductive pattern 322 and the second conductive pattern 324. An etching process may be adopted as the patterning process to form the first conductive pattern 322 and the second conductive pattern 324.

Figure 14:
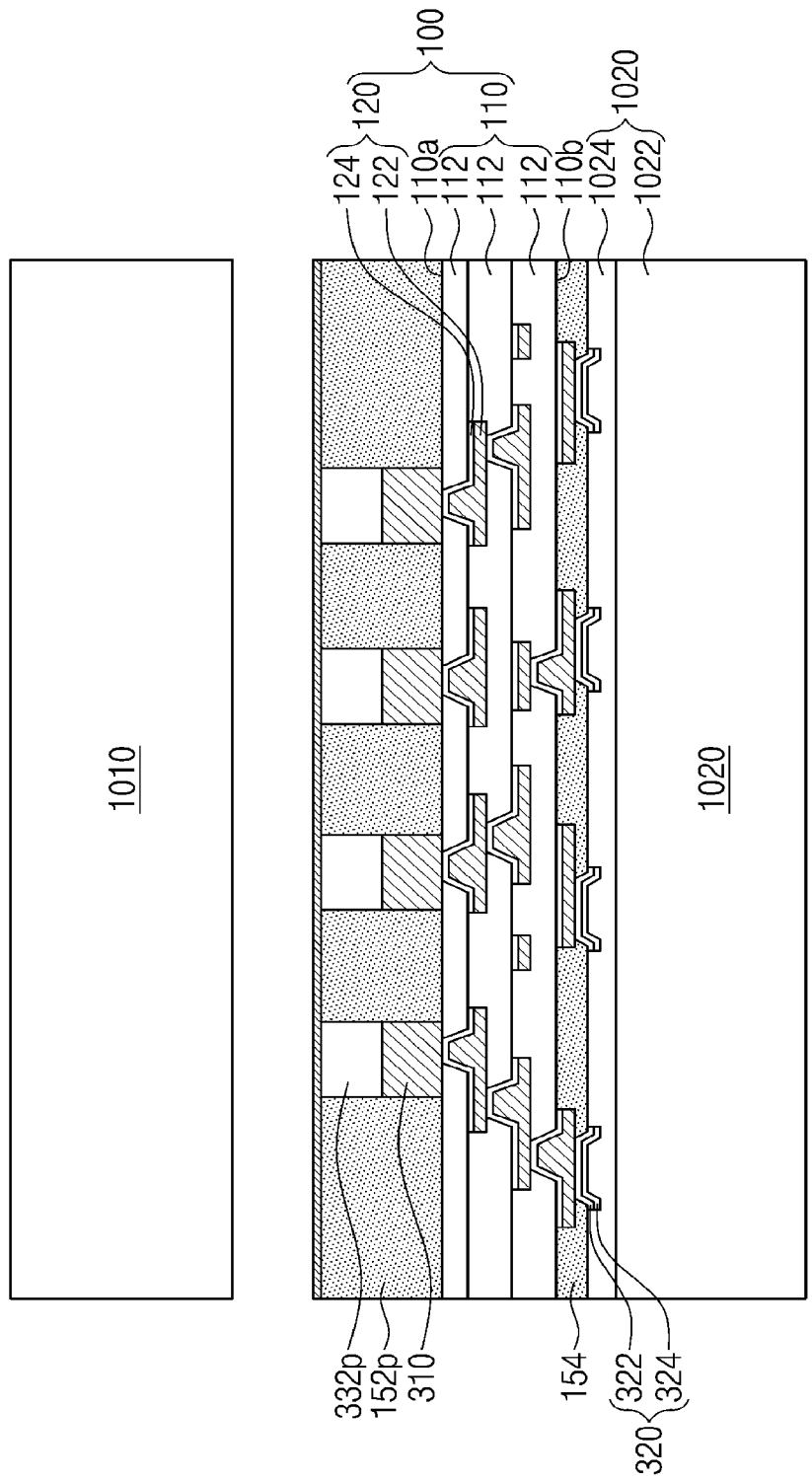

Referring to FIG. 14, the second passivation layer 154 may be attached to a second carrier substrate 1020 that includes a support 1022 and a buffer 1024, and the redistribution substrate 100 may be turned upside down. The top surfaces of components included in semiconductor packages discussed with reference FIGS. 10 to 13 may be hereinafter called bottom surfaces, and the bottom surfaces thereof may be hereinafter called top surfaces.

The second carrier substrate 1020 may support the redistribution substrate 100. The first carrier substrate 1010 may be separated from the top surface of the lower seed layer 350.

Figure 15:
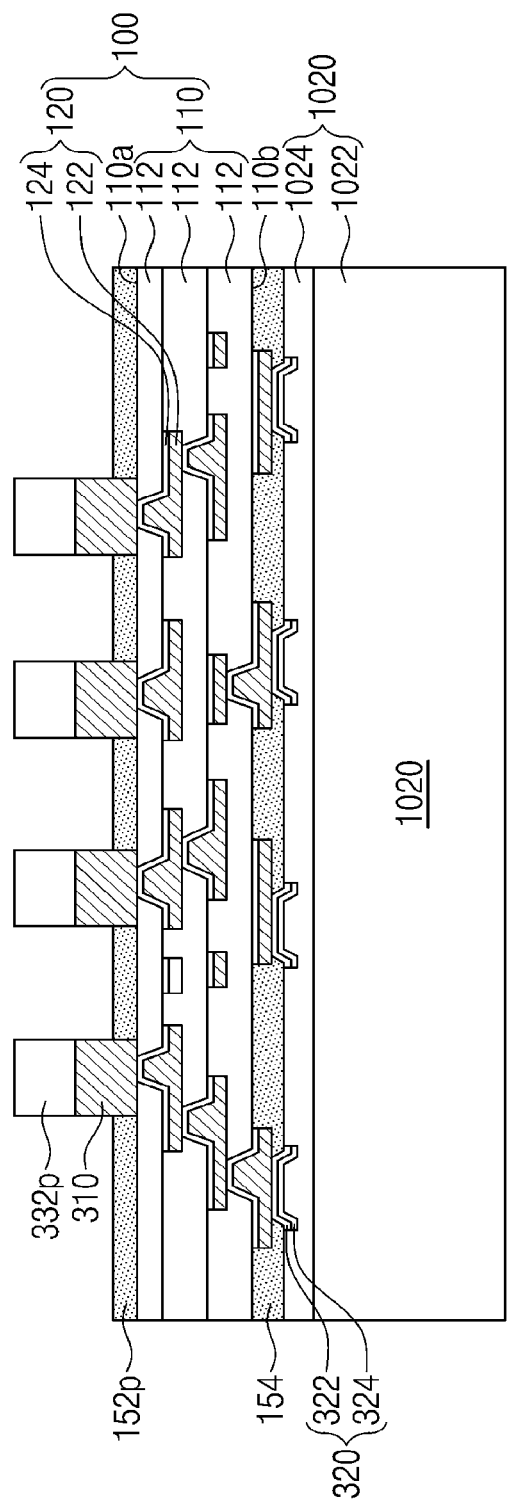

Referring to FIG. 15, the lower seed layer 350 may be removed, e.g., by a dry etching process or a wet etching process. After that, the preliminary first passivation layer 152p may be partially removed to lower a level of the top surface of the preliminary first passivation layer 152p. The partial removal of the preliminary first passivation layer 152p may be achieved by performing a wet etching process and a plasma etching process. The wet etching and plasma etching processes may be executed until the level of the top surface of the preliminary first passivation layer 152p to approach closer to a bottom surface of the conductive pillar 310 than to a top surface of the conductive pillar 310. As the top surface of the preliminary first passivation layer 152p is located at a lower level, the preliminary first connection terminals 332p may have completely exposed lateral surfaces, and the conductive pillars 310 may have partially exposed lateral surfaces. The preliminary first passivation layer 152p having a top surface at a lower level may constitute the first passivation layer 152, as shown in FIG. 16.

Figure 16:
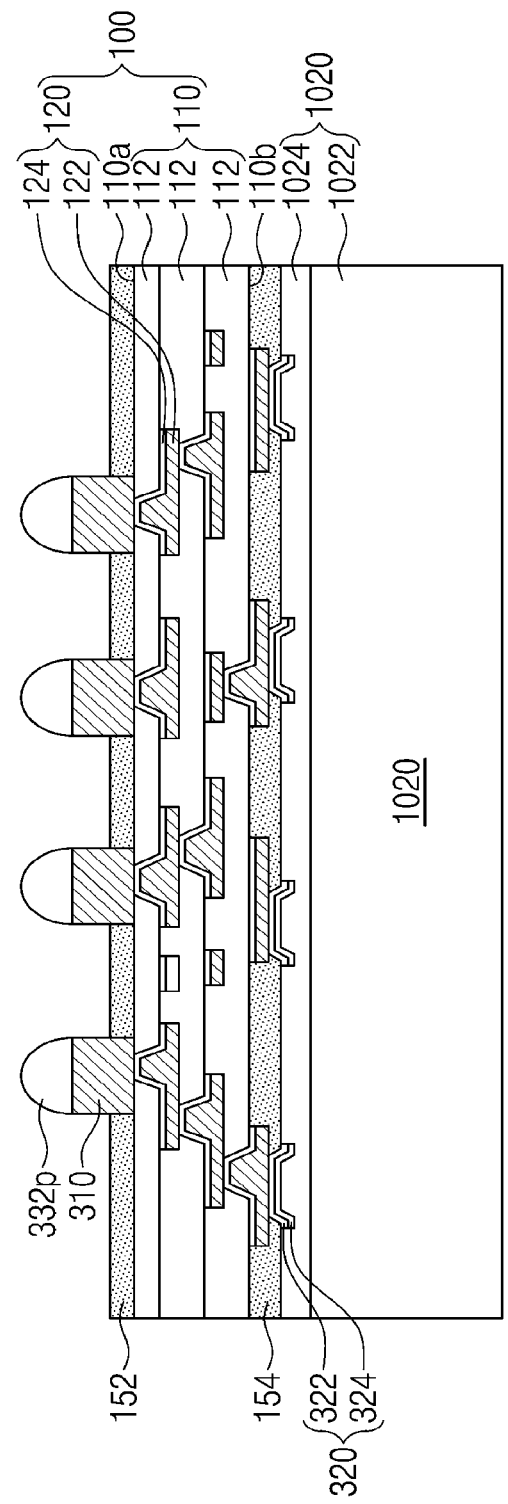

Referring to FIG. 16, a reflow process may be performed to melt the preliminary first connection terminals 332p. The reflow process may be executed at a temperature range of about 150° C. to about 250° C. The reflowed preliminary first connection terminals 332p may each have a hemispheric shape due to surface tension. The reflowed preliminary first connection terminals 332p may each have a width that decreases with increasing distance from the redistribution substrate 100.

Figure 17:
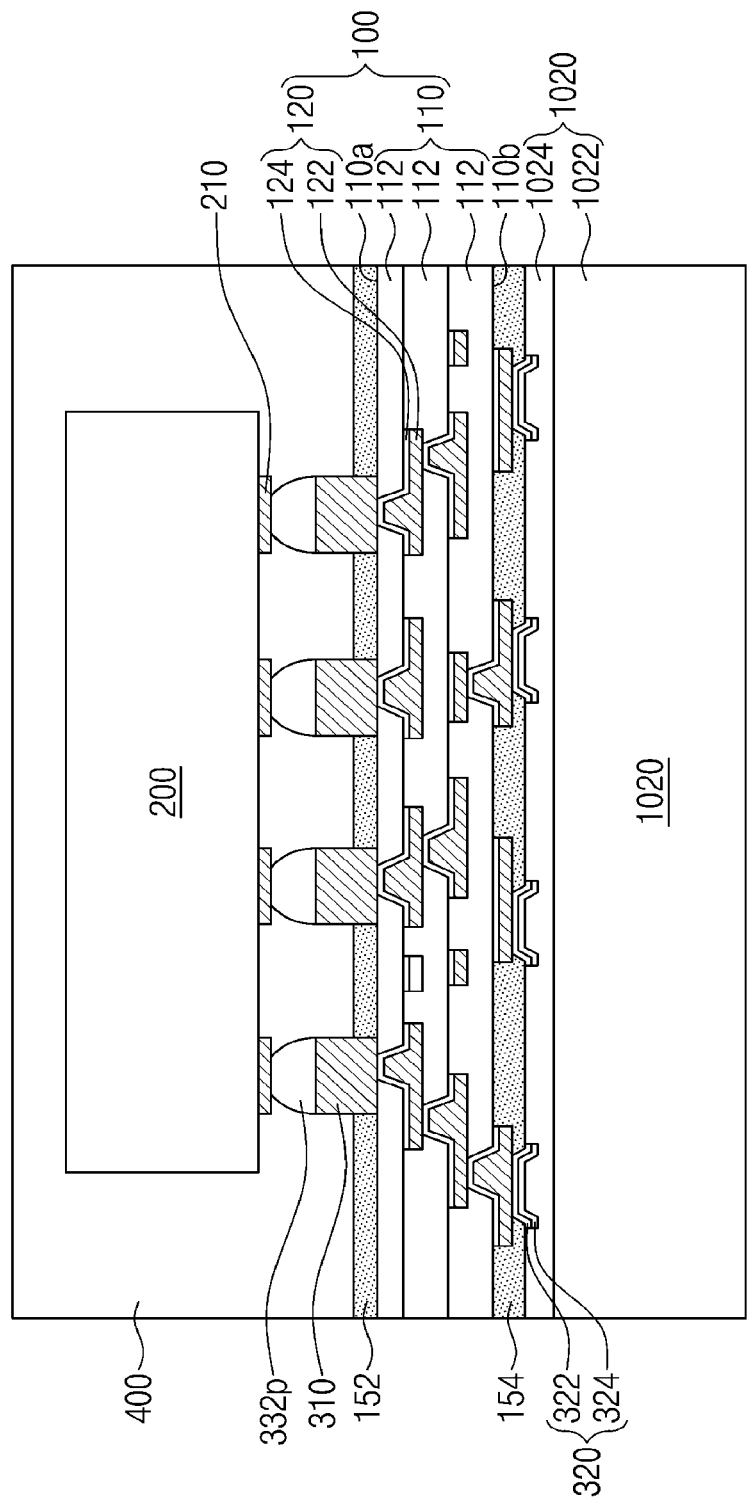

Referring to FIG. 17, the semiconductor chip 200 including the chip pads 210 may be mounted on the redistribution substrate 100 to allow the chip pads 210 to face the preliminary first connection terminals 332p. Afterwards, the molding layer 400 may be formed to cover the semiconductor chip 200. The molding layer 400 may extend between the semiconductor chip 200 and the first passivation layer 152 to thereby encapsulate the semiconductor chip 200, the preliminary first connection terminals 332p, and the conductive pillars 310.

After that, the second carrier substrate 1020 may be removed to expose the second passivation layer 154 and the conductive support patterns 320.

Referring back to FIG. 1, the second connection terminals 334 may be disposed on bottom surfaces of the conductive support patterns 320. The formation of the second connection terminals 334 may include performing a solder-ball attaching process. Through the processes discussed above, a semiconductor package may be fabricated.

Figure 18:
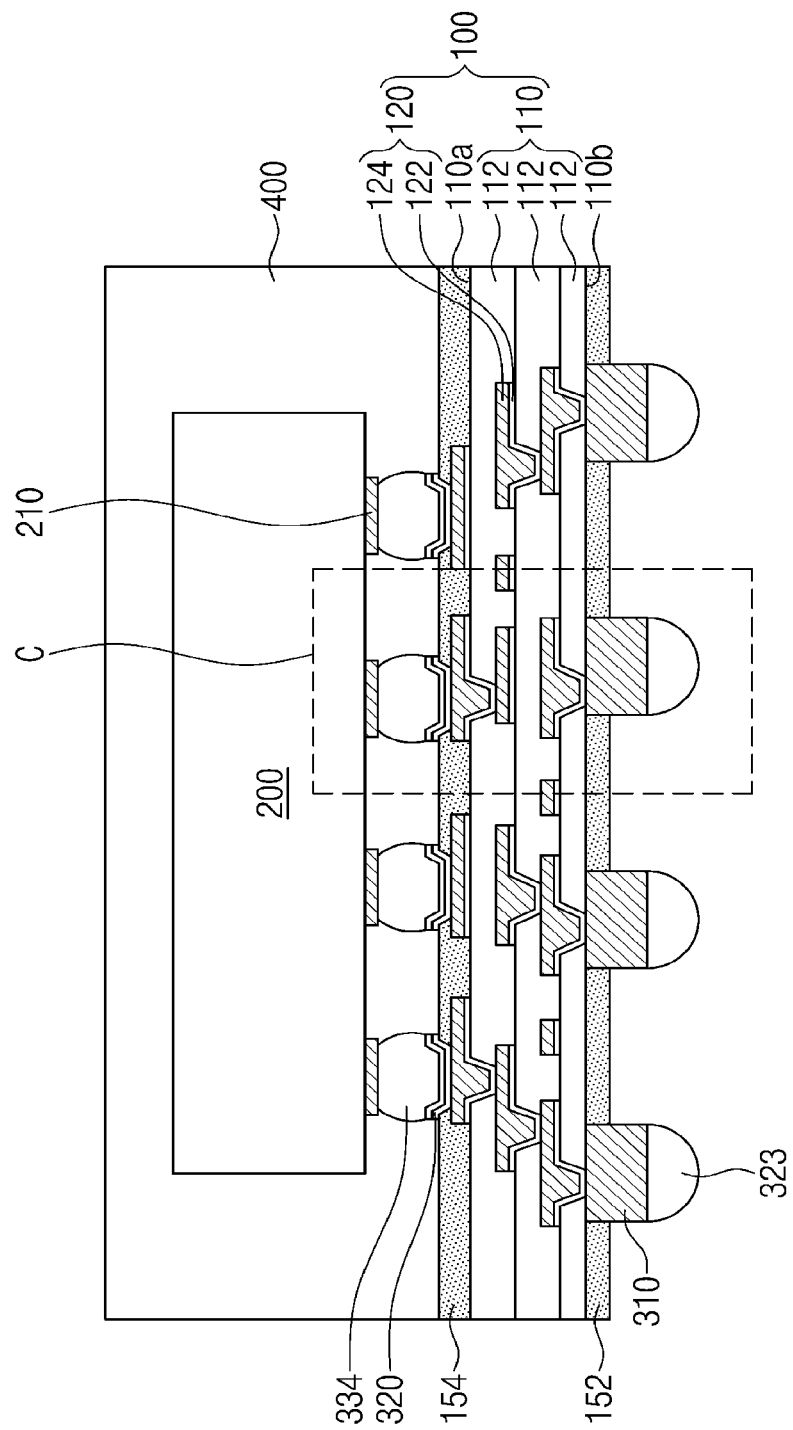
FIG. 18 illustrates a cross-sectional view of a semiconductor package according to some example embodiments.
Figure 19:
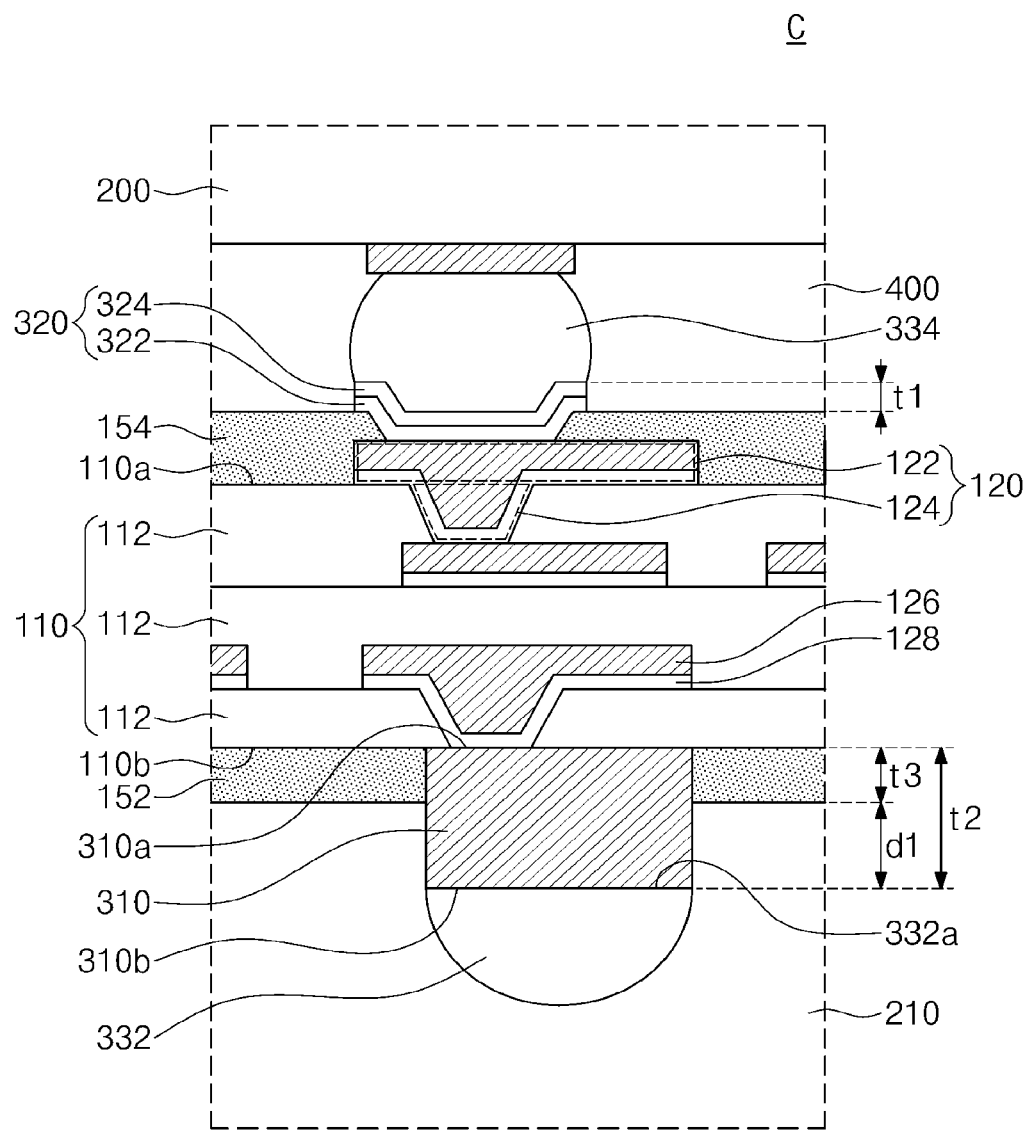
FIG. 19 illustrates an enlarged cross-sectional view of section C of FIG. 18.

FIG. 18 illustrates a cross-sectional view of a semiconductor package according to some example embodiments. FIG. 19 illustrates an enlarged cross-sectional view of section C of FIG. 18. Duplicate descriptions are brief or omitted below.

Referring to FIGS. 18 and 19, the conductive pillar 310 may be disposed on the bottom surface 110b of the dielectric layer 110, and the conductive support pattern 320 may be disposed on the top surface 110a of the dielectric layer 110. That is, the conductive support pattern 320 may be between the semiconductor chip 200 and the redistribution substrate 100.

The redistribution substrate 100 may include the dielectric layer 110 and the wiring patterns 120 in the dielectric layer 110. The dielectric layer 110 may be the same as discussed with reference to FIGS. 1 to 2B.

The wiring patterns 120 may be disposed in the dielectric layer 110. As shown in FIG. 19, the wiring patterns 120 may each include the line part 122 and the via part 124. The line parts 122 of the wiring patterns 120 may extend in a direction parallel to one surface of the dielectric pattern 112 to thereby constitute an electrical circuit. The line part 122 may have a bottom surface coplanar with the top surface of the dielectric pattern 112, and may also have lateral and bottom surfaces surrounded by the dielectric pattern 112 or the second passivation layer 154.

The via part 124 of the wiring pattern 120 may be provided on and connected to the line part 122 of the wiring pattern 120. The via part 124 may be disposed closer than the line part 122 to the bottom surface 110b of the dielectric layer 110. The via part 124 may have a width less than that of the line part 122. The width of the via part 124 may decrease with decreasing distance from the bottom surface 110b of the dielectric layer 110. The via part 124 may penetrate at least a portion of the dielectric pattern 112 to electrically connect the line parts 122 located at different levels. In addition, the via part 124 of an uppermost wiring pattern 120 may completely penetrate the dielectric patterns 112 to thereby electrically connect the line part 122 to the conductive pillar 310.

Each of the via and line parts 124 and 122 of each wiring pattern 120 may include the conductive layer 126 and the seed layer 128 on the conductive layer 126. The seed layer 128 may partially cover a bottom surface of the conductive layer 126 of the line part 122. The line part 122 of an uppermost wiring pattern 120 may have lateral and bottom surfaces that are surrounded by the second passivation layer 154. The dielectric pattern 112 may surround lateral and top surfaces of the conductive layer 126 of the line part 122 included in each of the wiring patterns 120 other than the uppermost wiring pattern 120.

The conductive layer 126 of the via part 124 may have a width that decreases with decreasing distance from the bottom surface 110b of the dielectric layer 110. The seed layer 128 of the via part 124 may conformally cover bottom and lateral surfaces of the conductive layer 126 of the via part 124.

As shown in FIG. 19, the conductive pillar 310 may be directly connected to the uppermost wiring pattern 120 most adjacent to the bottom surface 110b of the dielectric layer 110. The line part 122 of the uppermost wiring pattern 120 may be positioned on a top surface of a lowermost one of the dielectric patterns 112. The via part 124 of the lowermost wiring pattern 120 may be positioned between the line part 122 of the lowermost wiring pattern 120 and a top surface 310a of the conductive pillar 310.

The first passivation layer 152 may be disposed on the bottom surface 110b of the dielectric layer 110. The first passivation layer 152 may cover a bottom surface of the lowermost dielectric pattern 112. The first passivation layer 152 may cover an upper lateral surface of the conductive pillar 310. The first passivation layer 152 may have a thickness t3 equal to or less than half a thickness t2 of the conductive pillar 310. For example, a distance d1 between a bottom surface 310b of the conductive pillar 310 and a bottom surface of the first passivation layer 152 may be greater than the thickness t3 of the first passivation layer 152.

The conductive pillar 310 may penetrate the first passivation layer 152 and may be connected to the wiring pattern 120 in the redistribution substrate 100. The conductive pillar 310 may be flat at the top and bottom surfaces 310a and 310b thereof. The top surface 310a of the conductive pillar 310 may cover the bottom surface of the lowermost dielectric pattern 112 and a lowermost surface of the seed layer 128. The top surface 310a of the conductive pillar 310 may be coplanar with a top surface of the first passivation layer 152. The top surface 310a of the conductive pillar 310 may be parallel to the bottom surface 310b of the conductive pillar 310. The via part 124 of the lowermost wiring pattern 120 may have a bottom surface that covers a portion of the top surface 310a of the conductive pillar 310, but does not cover another portion of the top surface 310a of the conductive pillar 310. The seed layer 128 of the uppermost wiring pattern 120 may have a bottom surface in direct contact with the bottom surface 310b of the conductive pillar 310.

The semiconductor chip 200 may be provided on the top surface 110a of the redistribution substrate 100. The chip pads 210 may be provided on a bottom surface of the semiconductor chip 200.

The first connection terminals 332 may be disposed on the bottom surfaces 310b of the conductive pillars 310. The first connection terminals 332 may be electrically connected to the semiconductor chip 200 through the redistribution substrate 100, the conductive support patterns 320, and the second connection terminals 334. The first connection terminals 332 may have therebetween a pitch greater than that of the second connection terminals 334. In addition, the first connection terminal 332 may have a width greater than that of the second connection terminal 334. The first connection terminals 332 may include, for example, a solder ball or a solder bump.

The conductive support patterns 320 may be disposed on a top surface of the second passivation layer 154. The conductive support pattern 320 may penetrate the second passivation layer 154 and may be connected to the wiring pattern 120 in the redistribution substrate 100. The conductive support pattern 320 may have a thickness t1 and an uneven shape. The conductive support pattern 320 may have top and bottom surfaces that are more uneven than the top and bottom surfaces 310a and 310b of the conductive pillar 310. A central portion of the bottom surface of the conductive support pattern 320 may protrude toward the top surface 110a of the dielectric layer 110. A central portion of the top surface of the conductive support pattern 320 may be recessed toward the top surface 110a of the dielectric layer 110.

The second connection terminals 334 may be disposed between the chip pads 210 and the conductive support patterns 320. The second connection terminals 334 may electrically connect the conductive pillars 310 to the chip pads 210 of the semiconductor chip 200. The second connection terminals 334 may include, for example, a solder ball or a solder bump.

The second passivation layer 154 may be provided thereon with the molding layer 400 that covers top, bottom, and lateral surfaces of the semiconductor chip 200. The molding layer 400 may fill a space between the semiconductor chip 200 and the second passivation layer 154. The molding layer 400 may cover a top surface of the second passivation layer 154 and portions of lateral surfaces of the second connection terminals 334. In addition, the molding layer 400 may cover lateral surfaces of the conductive support patterns 320. The molding layer 400 may have a bottom surface in direct contact with the top surface of the second passivation layer 154.

Figure 20:
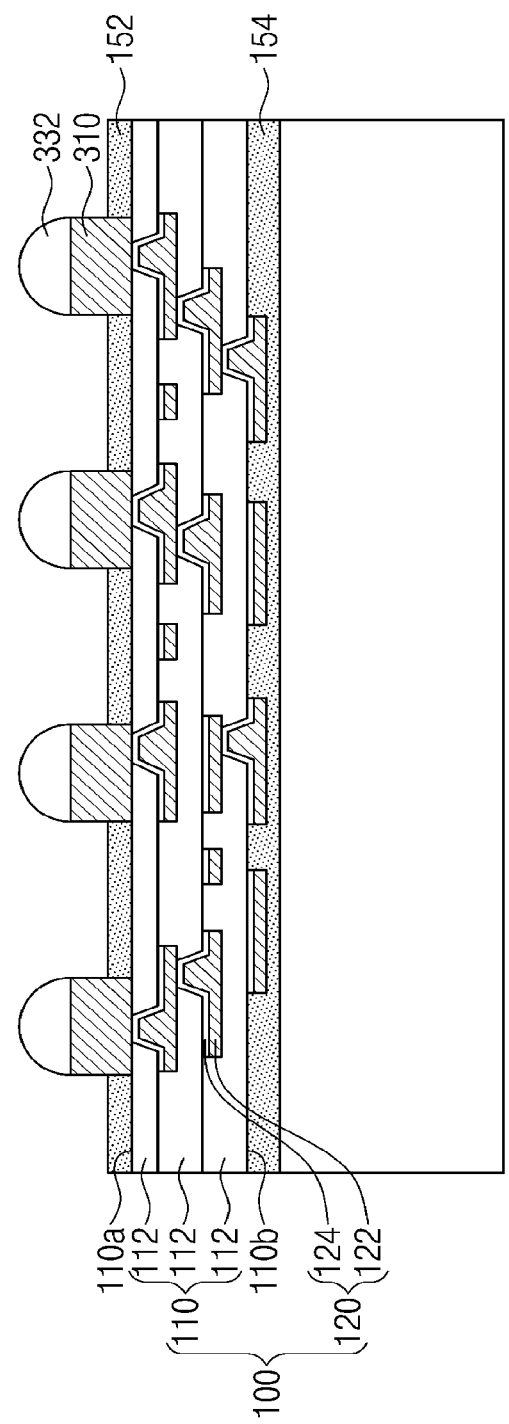
FIGS. 20 and 21 illustrate cross-sectional views of stages in a method of fabricating a semiconductor package according to some example embodiments.
Figure 21:
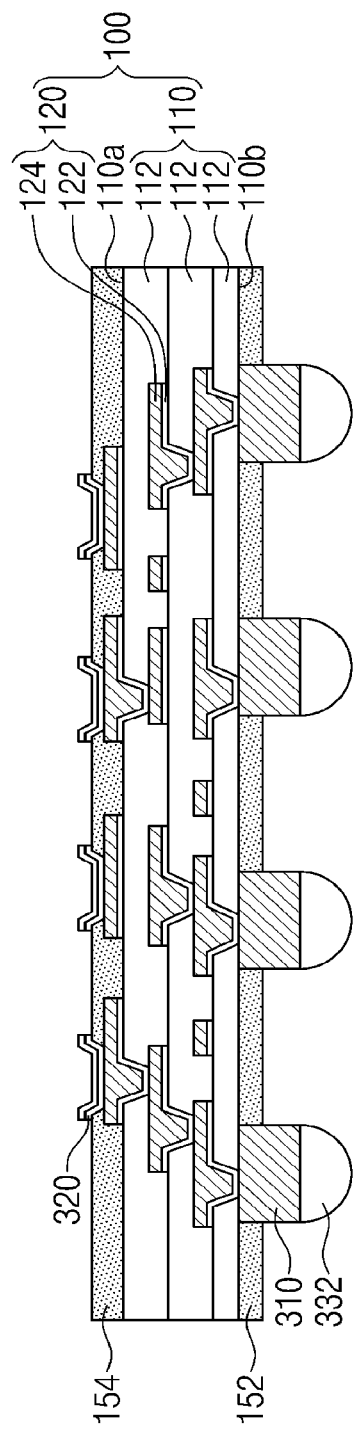

FIGS. 20 and 21 illustrate cross-sectional views of stages in a method of fabricating a semiconductor package according to some example embodiments. A duplicate description discussed above will be omitted below.

Referring to FIGS. 18, 20, and 21, a semiconductor package according to some example embodiments may include the semiconductor chip 200 mounted on the top surface 110a of the dielectric layer 110 on which the conductive support patterns 320 are formed.

FIGS. 22 to 25 illustrate cross-sectional views of a semiconductor package according to some example embodiments.

Figure 22:
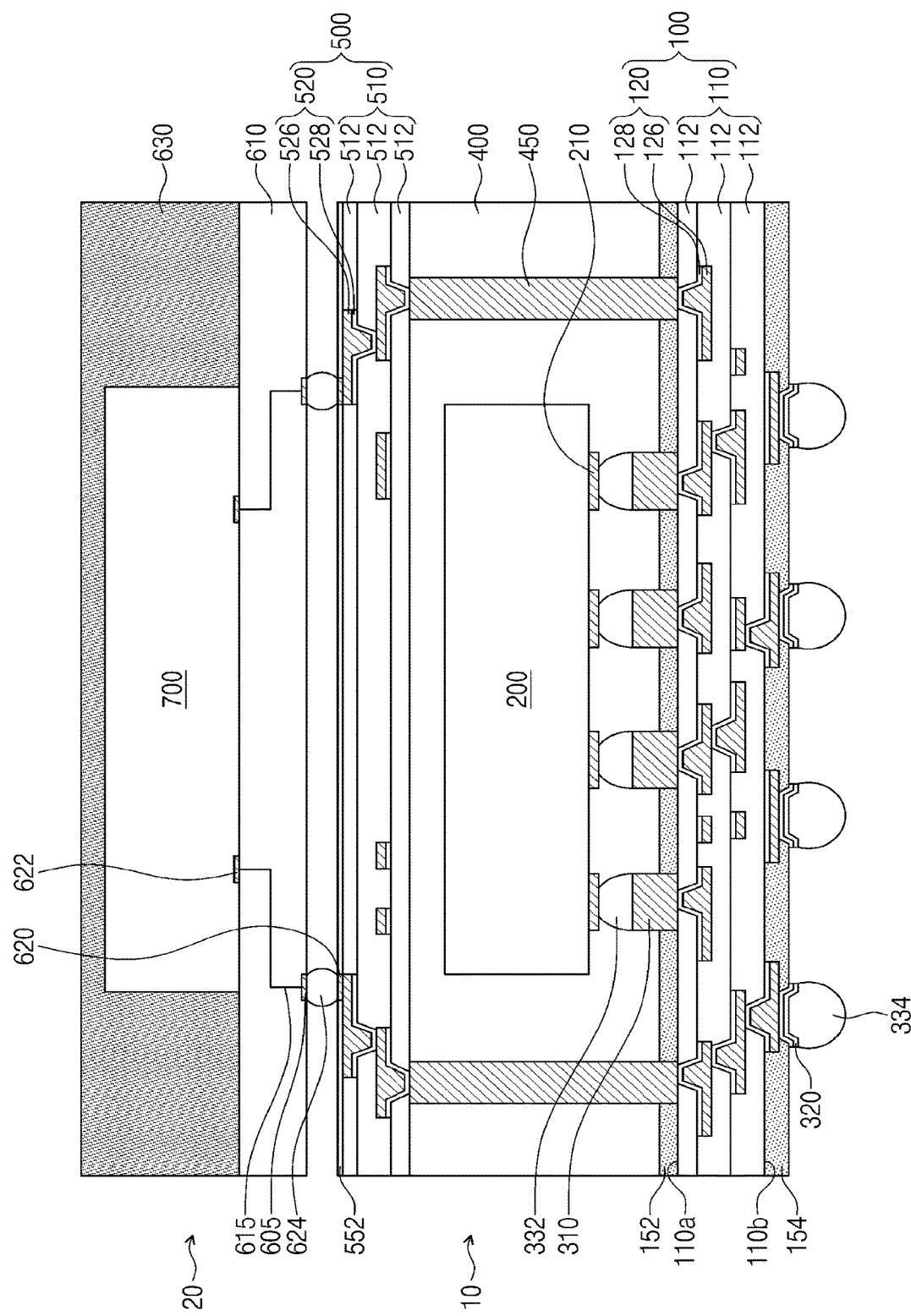
FIGS. 22 to 25 illustrate cross-sectional views of a semiconductor package according to some example embodiments.

Referring to FIG. 22, a semiconductor package may include a lower package 10 and an upper package 20. For example, the semiconductor package may be a package-on-package (POP) in which the upper package 20 is mounted on the lower package 10.

The lower package 10 may include components similar to those of the semiconductor package discussed with reference to FIGS. 1 to 2B. For example, the lower package 10 may include the redistribution substrate 100, the semiconductor chip 200, and the molding layer 400, and may further include connection members that connect the semiconductor chip 200 to an external device. The connection members may include the first connection terminals 332, the conductive pillars 310, the second connection terminals 334, and the conductive support patterns 320. The redistribution substrate 100 may include therein the wiring patterns 120 ones of which are disposed on an outer region of the redistribution substrate 100.

Conductive vias 450 may be provided on the redistribution substrate 100. The conductive vias 450 may be disposed on the outer region of the redistribution substrate 100, while being horizontally spaced apart from the semiconductor chip 200. The conductive vias 450 may vertically penetrate the molding layer 400. The conductive vias 450 may be coupled to the wiring patterns 120 disposed on the outer region of the redistribution substrate 100. The conductive vias 450 may be electrically connected through the redistribution substrate 100 to the second connection terminals 334 or the semiconductor chip 200. The conductive vias 450 may include a metal pillar. The conductive vias 450 may include, e.g., copper (Cu).

The molding layer 400 may be formed on the redistribution substrate 100, thereby covering the semiconductor chip 200. The molding layer 400 may cover lateral surfaces of the conductive vias 450 and may not cover top surfaces of the conductive vias 450. The molding layer 400 may have a top surface coplanar with those of the conductive vias 450.

The lower package 10 may further include an upper redistribution layer 500. The upper redistribution layer 500 may be disposed on the top surface of the molding layer 400 and the top surfaces of the conductive vias 450. The upper redistribution layer 500 may include an upper dielectric layer 510 and an upper redistribution pattern 520. The upper dielectric layer 510 may include a plurality of upper dielectric patterns 512 that are vertically stacked. The upper redistribution pattern 520 may include an upper conductive layer 526 and an upper seed layer 528 on a bottom surface of the upper conductive layer 526.

An upper pad 620 may be provided on and coupled to the upper redistribution pattern 520. The upper pad 620 may include a conductive material, e.g., metal.

The upper redistribution layer 500 may further include an upper protection layer 552. The upper protection layer 552 may cover a top surface of the upper dielectric layer 510, a top surface of the upper redistribution pattern 520, and a lateral surface of the upper pad 620. The upper protection layer 552 may include, e.g., a dielectric polymer.

The upper package 20 may be mounted on the lower package 10. The upper package 20 may include an upper package substrate 610, an upper semiconductor chip 700, and an upper molding layer 630. For example, the upper package substrate 610 may be a printed circuit board (PCB).

The upper semiconductor chip 700 may be disposed on the upper package substrate 610. The upper semiconductor chip 700 may include integrated circuits, and the integrated circuits may include a memory circuit, a logic circuit, or a combination thereof. The upper semiconductor chip 700 may be of a different type from the semiconductor chip 200. The upper semiconductor chip 700 may include upper chip pads 622 each of which is electrically connected to a metal pad 605 through an internal line 615 in the upper package substrate 610. The internal line 615 is schematically illustrated in FIG. 22, and a shape and arrangement of the internal line 615 may be variously changed.

The upper package substrate 610 may be provided thereon with the upper molding layer 630 that covers the upper semiconductor chip 700. The upper molding layer 630 may include a dielectric polymer, e.g., an epoxy-based polymer.

Conductive terminals 624 may be disposed between the lower package 10 and the upper package 20. The conductive terminal 624 may be interposed between and electrically connect the upper pad 620 and the metal pad 605.

Figure 23:
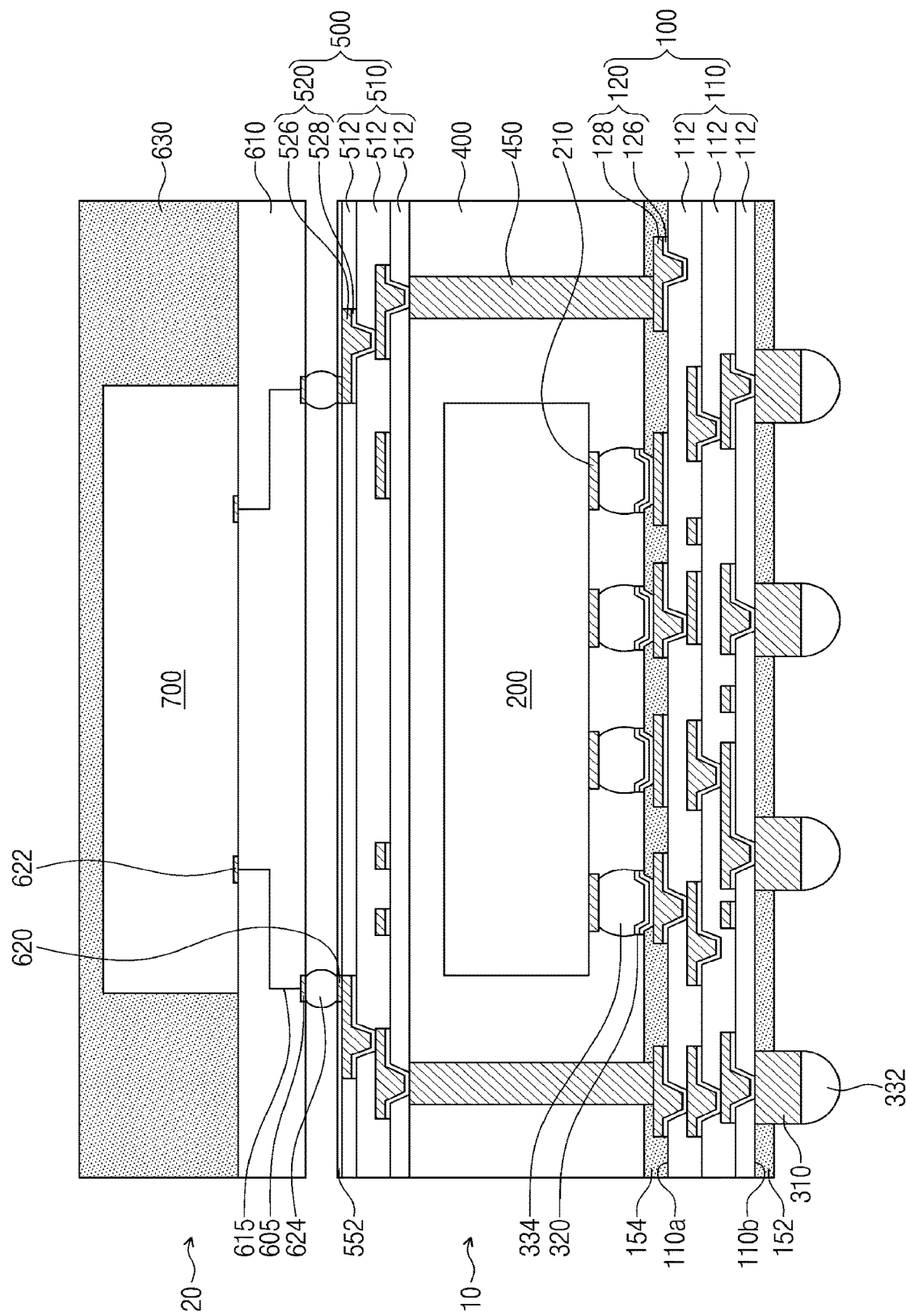

Referring to FIG. 23, the lower package 10 of a semiconductor package may include components similar to those of the semiconductor package discussed with reference to FIGS. 18 and 19. For example, the conductive support patterns 320 and the second connection terminals 334 may be disposed on the top surface 110a of the dielectric layer 110. The second connection terminals 334 may electrically connect the conductive support patterns 320 to the chip pads 210 of the semiconductor chip 200. The conductive pillars 310 and the first connection terminals 332 may be disposed on the bottom surface 110b of the dielectric layer 110. Other configurations may be similar to those discussed with reference to FIG. 22.

Figure 24:
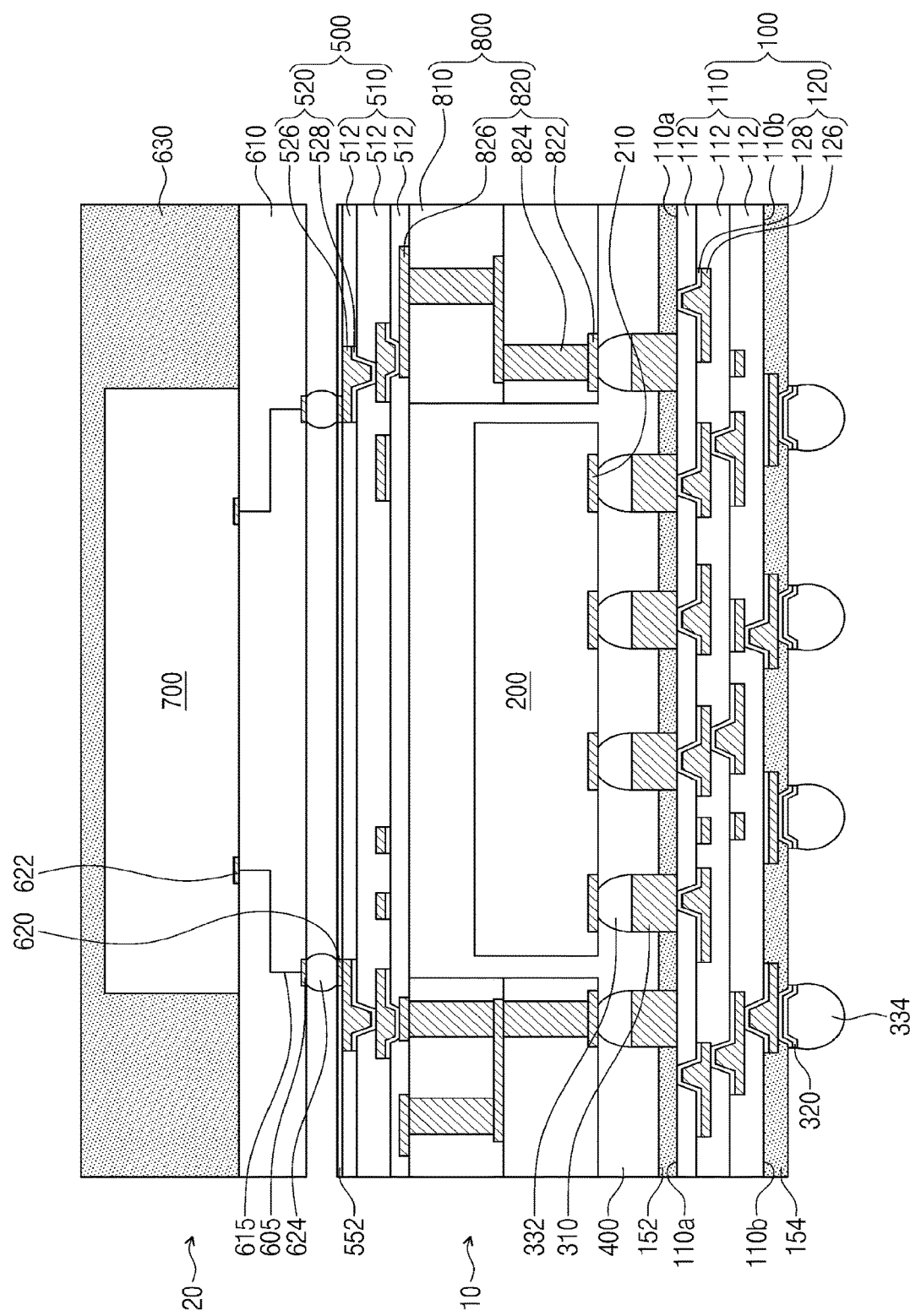

Referring to FIG. 24, the lower package 10 may further include a connection substrate 800 between the redistribution substrate 100 and the upper redistribution layer 500. The connection substrate 800 may have an opening. The opening may vertically penetrate the connection substrate 800.

The connection substrate 800 may include base layers 810 and a conductor 820, or a wiring pattern provided in the base layers 810. The base layers 810 may be vertically stacked. The base layers 810 may include silicon oxide.

The conductor 820 may include inner pads 822, vias 824, and upper connection pads 826. Ones of the inner pads 822 may be disposed in the base layers 810 and may connect the vias 408 to each other. Others of the inner pads 822 may be disposed adjacent to a bottom surface of the base layer 810 and may be connected to the first connection terminals 332. The vias 408 may vertically penetrate the base layers 810. The upper connection pads 826 may be disposed on a top surface of an uppermost base layer 810 and may be connected to the upper redistribution patterns 520. The upper connection pads 826 may be covered with the upper dielectric patterns 512 of the upper redistribution layer 500.

The connection substrate 800 may have a bottom spaced apart from a top surface of the redistribution substrate 100. The connection substrate 800 and the redistribution substrate 100 may be electrically connected to each other through the first connection terminals 332 and the conductive pillars 310. The molding layer 400 may fill a space between the bottom surface of the connection substrate 800 and the top surface of the redistribution substrate 100.

Figure 25:
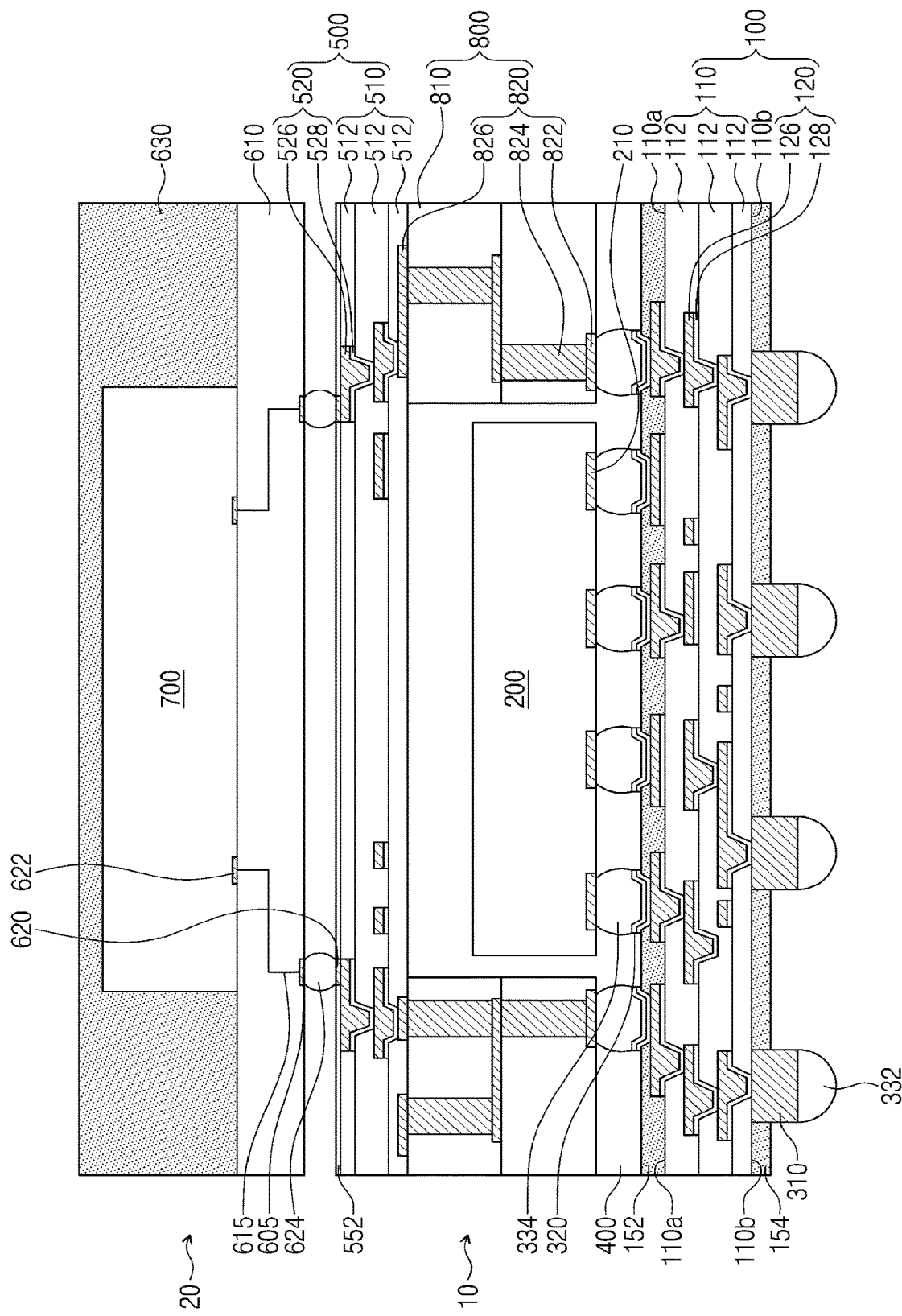

Referring to FIG. 25, the conductive support patterns 320 and the second connection terminals 334 may be disposed on the top surface 110a of the dielectric layer 110. Ones of the second connection terminals 334 may electrically connect the conductive support patterns 320 to the chip pads 210 of the semiconductor chip 200. Others of the second connection terminals 334 may connect the connection substrate 800 to the redistribution substrate 100.

By way of summation and review, high integration of semiconductor devices brings about miniaturization of pads that connect the plurality of stacked chips to each other. However, the miniaturization of pads requires a precise alignment between the plurality of stacked chips.

Therefore, example embodiments provide a semiconductor package with increased alignment accuracy between conductive structures on a redistribution layer, thereby reducing resistance and facilitating fabrication. That is, according to some example embodiments, a preliminary bump structure and a copper pillar are sequentially formed, and then a redistribution line is directly formed on the bottom surface of the copper pillar, thereby facilitating alignment of the bump structure with the redistribution line, so a semiconductor package may be provided with an increased alignment accuracy between conductive structures on a redistribution layer, thereby reducing resistance and facilitating fabrication.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a redistribution substrate that includes a dielectric layer and a wiring pattern in the dielectric layer, the wiring pattern having a line part that extends horizontally and a via part that extends vertically;
   a passivation layer on a top surface of the redistribution substrate;
   a conductive pillar that penetrates through the passivation layer, the conductive pillar in contact with the wiring pattern at the via part;
   a semiconductor chip including a chip pad on the conductive pillar; and
   a connection terminal between the top surface of the conductive pillar and a bottom surface of the chip pad;
   wherein a bottom surface of the conductive pillar is coplanar with a bottom surface of the passivation layer, and
   wherein the passivation layer contacts a portion of a lateral surface of the conductive pillar.

2. The semiconductor package as claimed in claim 1, wherein the top surface of the conductive pillar has a surface roughness greater than a surface roughness at the bottom surface of the conductive pillar.

3. The semiconductor package as claimed in claim 1, wherein a distance between a bottom surface of the connection terminal and a top surface of the passivation layer is greater than a thickness of the passivation layer.

4. The semiconductor package as claimed in claim 1, further comprising a molding layer in contact with a top surface of the passivation layer, the conductive pillar, and the connection terminal, a contact area between the molding layer and the conductive pillar being greater than a contact area between the passivation layer and the conductive pillar.

5. The semiconductor package as claimed in claim 1, wherein the wiring pattern includes a line part that extends horizontally and a via part connected to the line part, a width of the via part being less than a width of the line part, the via part being between the line part and the bottom surface of the conductive pillar, and the width of the via part decreasing with a decreasing distance from the bottom surface of the conductive pillar.

6. The semiconductor package as claimed in claim 5, wherein a width of the bottom surface of the conductive pillar is greater than a width of a top surface of the via part.

7. The semiconductor package as claimed in claim 1, wherein a distance between the top surface of the conductive pillar and a top surface of the passivation layer is between 2 times and about 5 times a thickness of the passivation layer.

8. The semiconductor package as claimed in claim 1, wherein a width of the connection terminal decreases with increasing distance from the top surface of the conductive pillar.

9. The semiconductor package as claimed in claim 1, wherein the conductive pillar has a cylindrical shape or a tetragonal pillar shape.

10. A semiconductor package, comprising:
  a lower redistribution substrate that includes a dielectric layer and a wiring pattern in the dielectric layer, the wiring pattern including:
    a line part that extends horizontally, and
    a via part connected to the line part, a width of the via part being less than a width of the line part;
  a passivation layer on a top surface of the lower redistribution substrate;
  a conductive pillar that penetrates through the passivation layer, the conductive pillar in contact with the wiring pattern at the via part;
  a semiconductor chip including a chip pad on the conductive pillar;
  a connection terminal between a top surface of the conductive pillar and a bottom surface of the chip pad;
  a molding layer covering the semiconductor chip and filling a space between the passivation layer and the semiconductor chip on the passivation layer;
  an upper redistribution layer on the molding layer; and
  a conductive via that is spaced apart from the semiconductor chip and penetrates through the molding layer, the conductive via connecting the lower redistribution substrate and the upper redistribution layer, wherein the molding layer covers a portion of a lateral surface of the conductive pillar.

11. The semiconductor package as claimed in claim 10, wherein a contact area between the molding layer and the conductive pillar is greater than a contact area between the passivation layer and the conductive pillar.

12. The semiconductor package as claimed in claim 10, wherein a width at a bottom surface of the conductive pillar is between 2 and 5 times a width at a top surface of the via part.

13. The semiconductor package as claimed in claim 10, wherein the via part is between the line part and a bottom surface of the conductive pillar, the width of the via part decreasing with a decreasing distance from the bottom surface of the conductive pillar.

14. The semiconductor package as claimed in claim 10, wherein a distance between the top surface of the conductive pillar and a top surface of the passivation layer is greater than a thickness of the passivation layer.

15. The semiconductor package as claimed in claim 10, wherein: the via part includes a conductive layer and a seed layer on the conductive layer, and the conductive pillar has a bottom surface in direct contact with the seed layer.

16. The semiconductor package as claimed in claim 10, wherein a width of the connection terminal decreases with increasing distance from the top surface of the conductive pillar.

17. The semiconductor package as claimed in claim 10, wherein the conductive pillar has a cylindrical shape or a tetragonal pillar shape.

18. A semiconductor package, comprising:
  a redistribution substrate that includes a dielectric layer and a wiring pattern in the dielectric layer;
  a first passivation layer on a bottom surface of the redistribution substrate;
  a conductive pillar that penetrates the first passivation layer, the conductive pillar being connected to the wiring pattern;
  a first connection terminal on a bottom surface of the conductive pillar;
  a second passivation layer on a top surface of the redistribution substrate;
  a conductive support pattern that penetrates the second passivation layer, the conductive support pattern being connected to the wiring pattern;
  a second connection terminal on the conductive support pattern;
  a semiconductor chip on the second connection terminal; and
  a molding layer covering the second connection terminal and the semiconductor chip on the second passivation layer, wherein the conductive support pattern extends on a top surface of the second passivation layer, and
  wherein the first passivation layer contacts a portion of a lateral surface of the conductive pillar and exposes another portion of the lateral surface of the conductive pillar.

19. The semiconductor package as claimed in claim 18, wherein the conductive support pattern includes a first conductive pattern and a second conductive pattern between the first conductive pattern and the second connection terminal, the first conductive pattern including a material different from a material of the second conductive pattern.

20. The semiconductor package as claimed in claim 18, wherein the wiring pattern includes a line part that extends horizontally and a via part connected to the line part, a width of the via part being less than a width of the line part, the conductive support pattern being connected to the line part, and the conductive pillar being connected to the via part.

* * * * *